(12) United States Patent
Bonora et al.

(10) Patent No.: US 9,184,078 B2
(45) Date of Patent: Nov. 10, 2015

(54) NARROW WIDTH LOADPORT MECHANISM FOR CLEANROOM MATERIAL TRANSFER SYSTEMS

(75) Inventors: Anthony C. Bonora, Portola Valley, CA (US); Richard Garcia, San Jose, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 529 days.

(21) Appl. No.: 13/464,923

(22) Filed: May 4, 2012

(65) Prior Publication Data

US 2012/0321417 A1 Dec. 20, 2012

Related U.S. Application Data

(60) Provisional application No. 61/483,642, filed on May 6, 2011.

(51) Int. Cl.
*H01L 21/677* (2006.01)
*H01L 21/67* (2006.01)
*H01L 21/687* (2006.01)

(52) U.S. Cl.
CPC .... *H01L 21/67775* (2013.01); *H01L 21/67265* (2013.01); *H01L 21/68707* (2013.01)

(58) Field of Classification Search
CPC ................ H01L 21/67201; H01L 21/67742; H01L 21/67775; H01L 21/67265; H01L 21/68707

USPC .......................................................... 414/217
See application file for complete search history.

(56) References Cited

U.S. PATENT DOCUMENTS

2003/0199173 A1* 10/2003 Ogawa et al. ................. 438/758
2004/0126206 A1* 7/2004 Araya et al. ................... 414/217
2007/0274810 A1* 11/2007 Holtkamp et al. ............ 414/217
2008/0249651 A1* 10/2008 Hosek et al. .................. 700/121

OTHER PUBLICATIONS

PCT International Search Report—PCT/US 12/36851—dated Jul. 18, 2012 (2 pages).

* cited by examiner

*Primary Examiner* — Saul Rodriguez
*Assistant Examiner* — Emery Hassan
(74) *Attorney, Agent, or Firm* — Martine Penilla Group, LLP

(57) ABSTRACT

A system and method of transporting substrates includes a loadport system including a frame, an articulating arm, a mini environment and a tower substantially centered in the frame. The tower includes multiple motors, a first motor mechanically coupled to the mini environment for moving the mini environment vertically. A second motors mechanically coupled to the articulating arm for moving the articulating arm vertically. A tower enclosure is also included. The tower enclosure enclosing the motors separate from the mini environment.

18 Claims, 43 Drawing Sheets

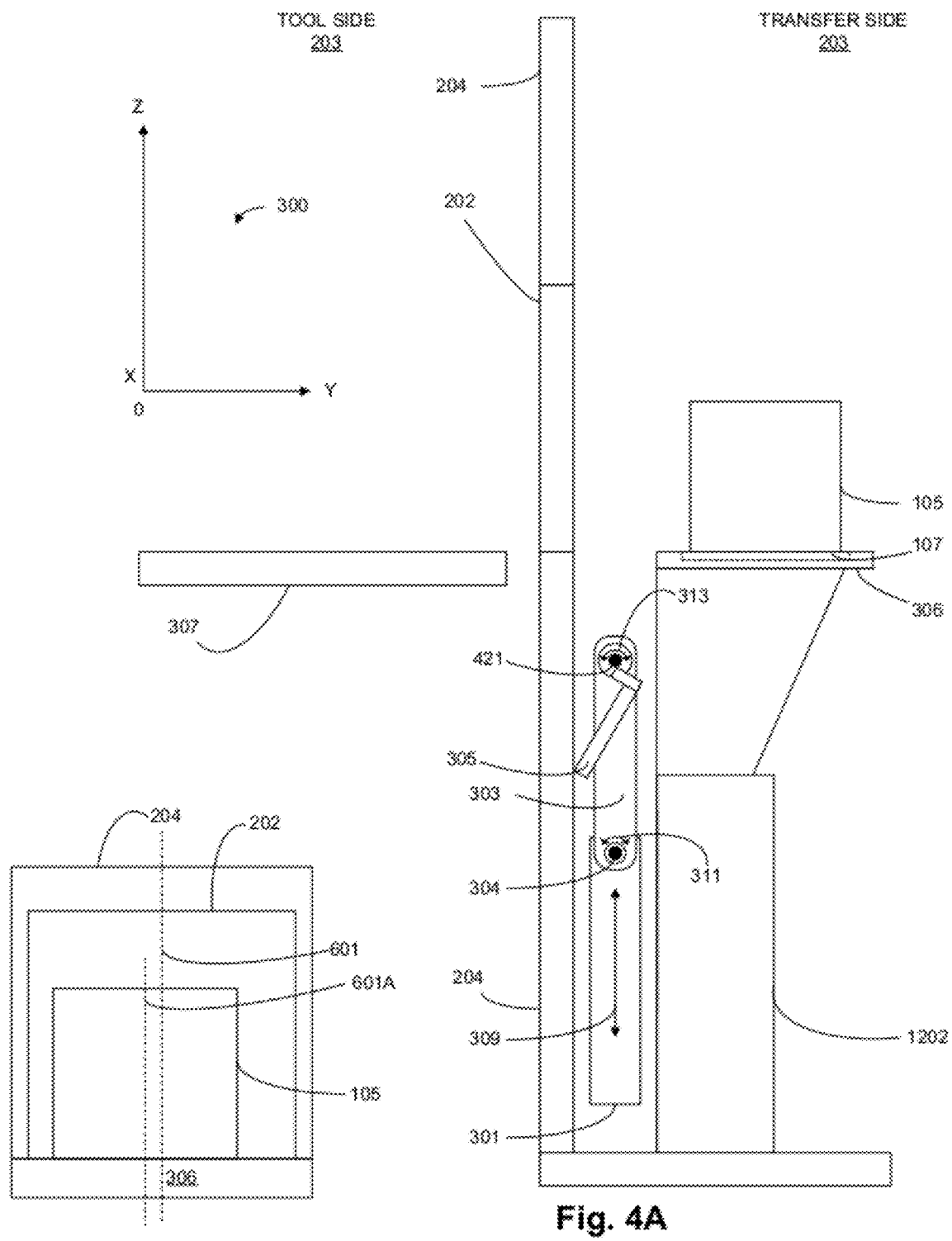

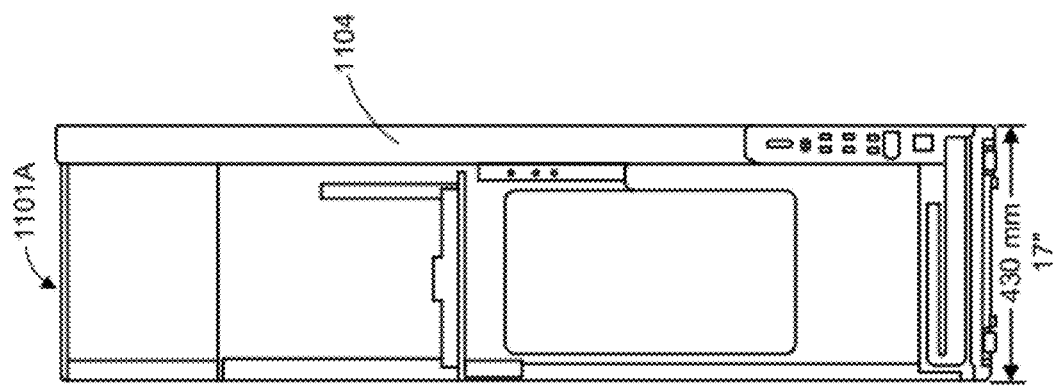
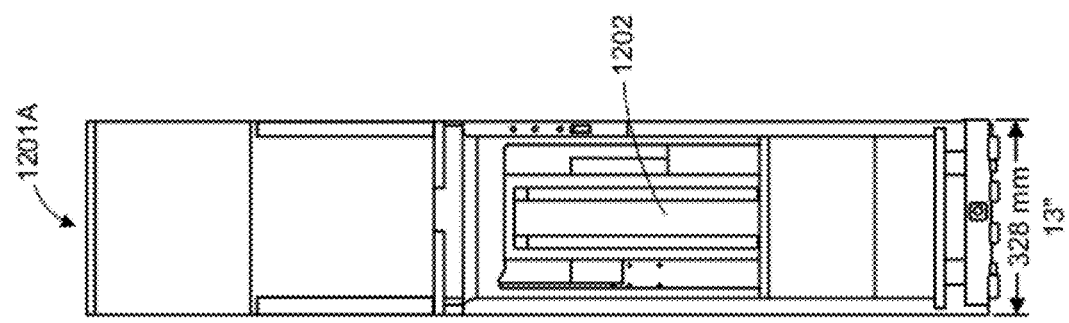

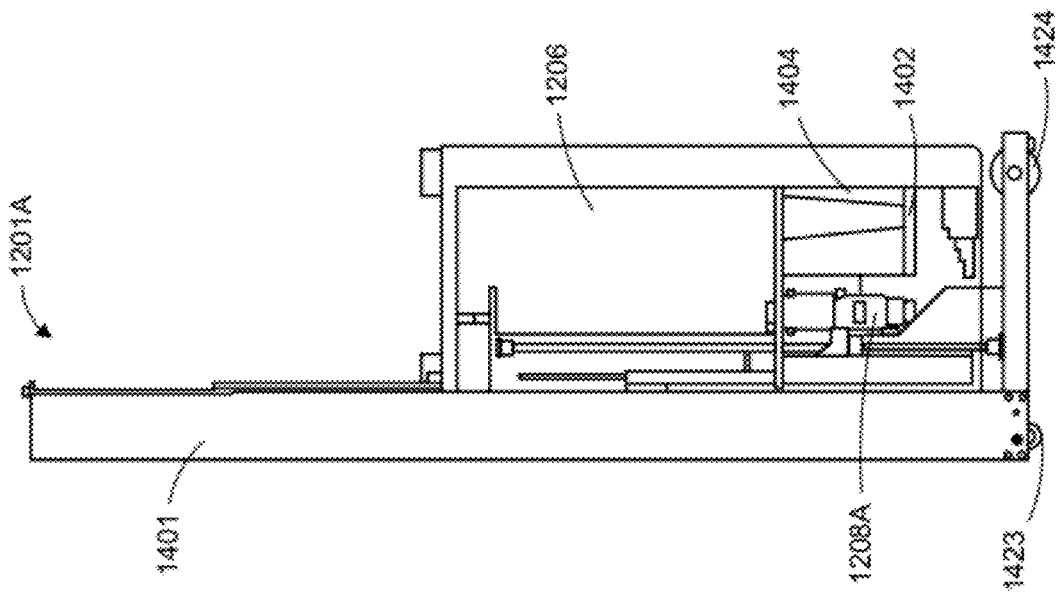
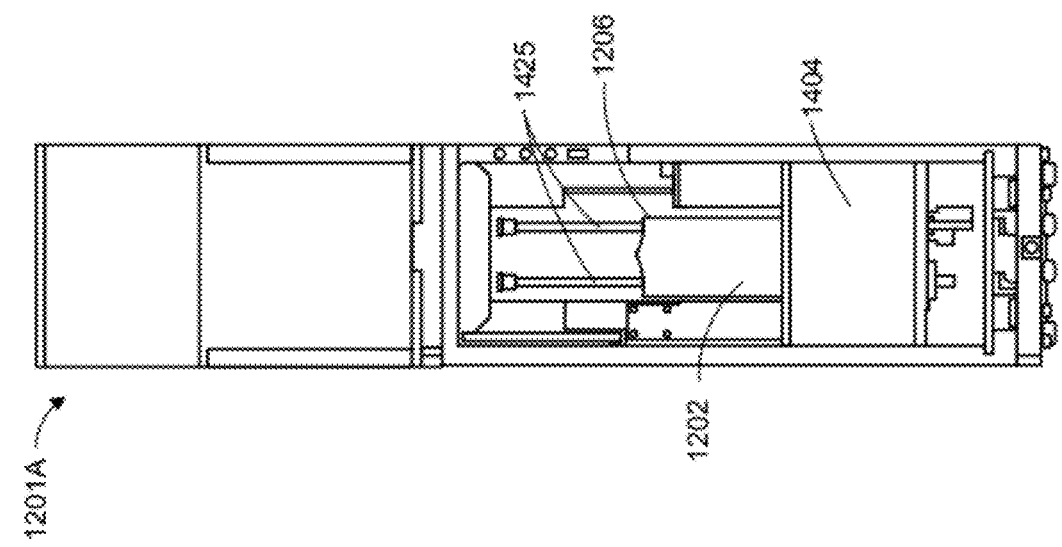

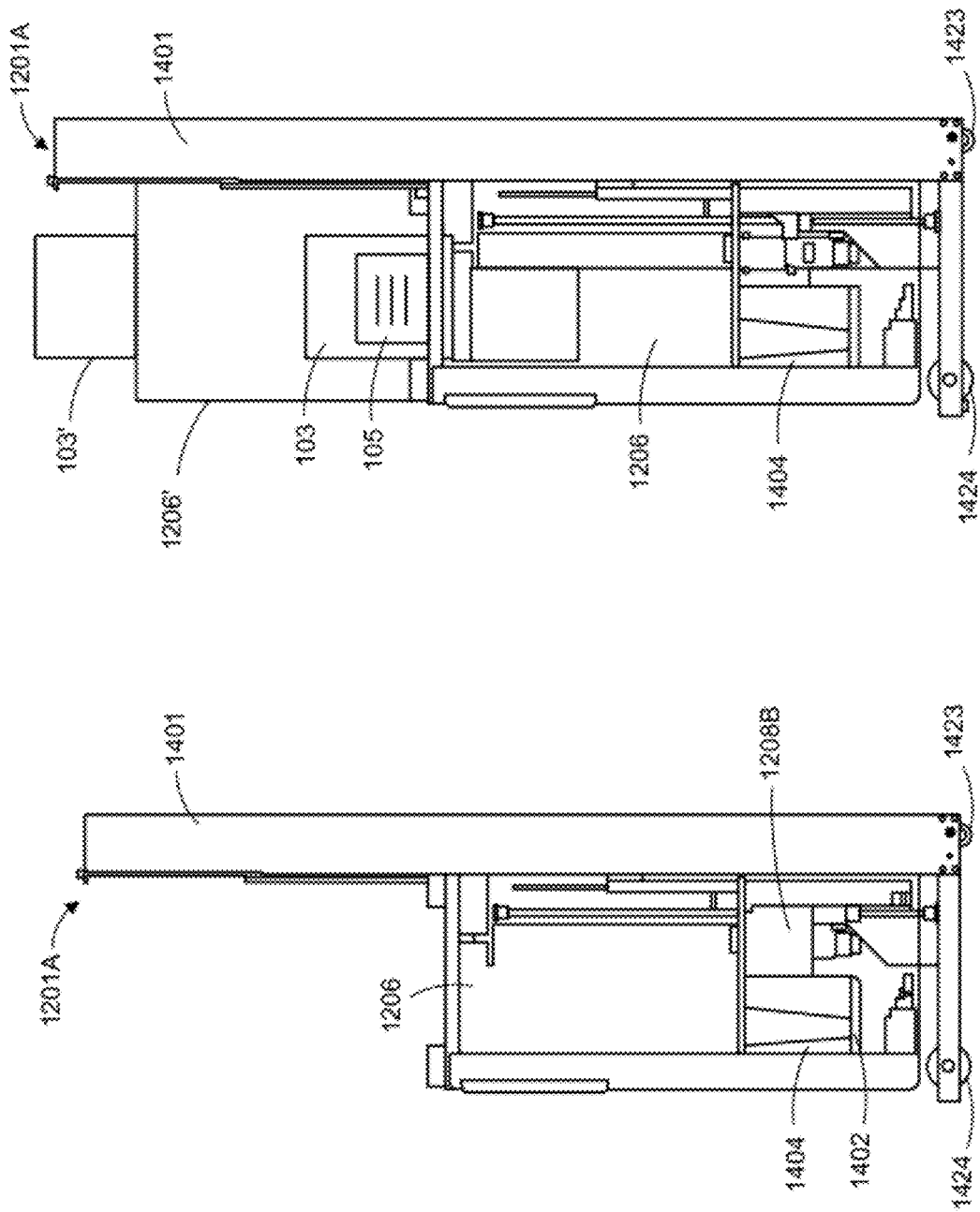

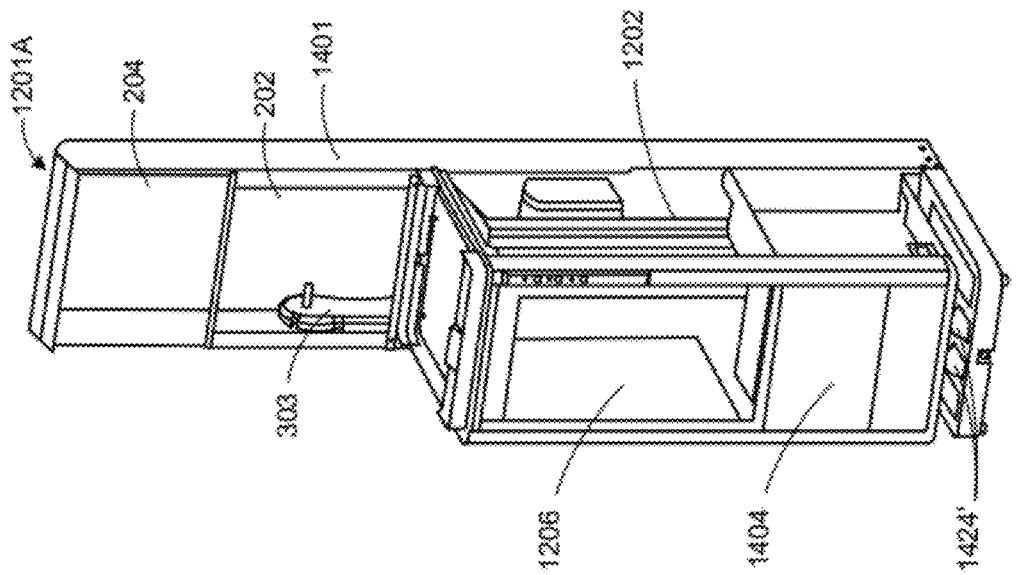
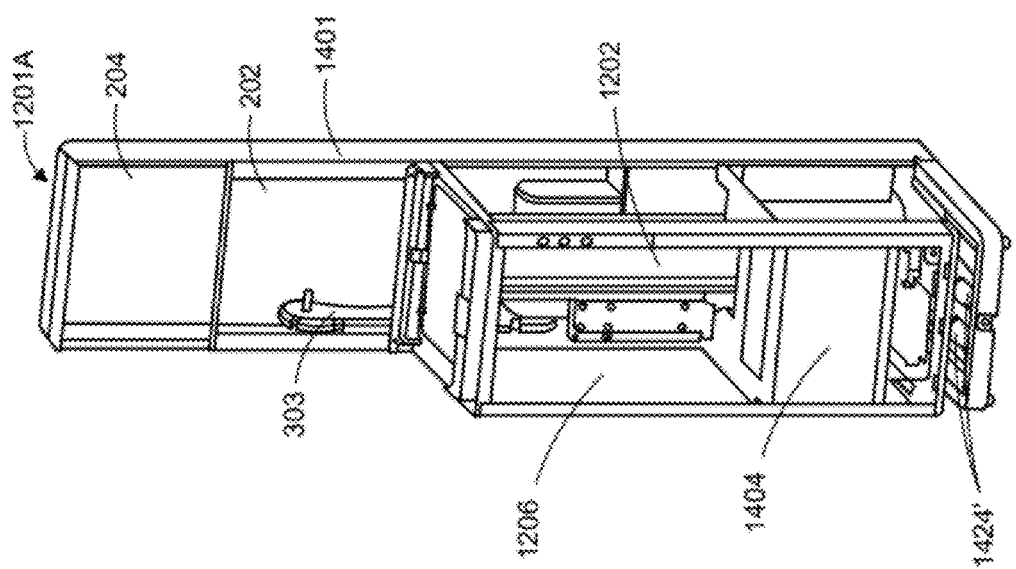

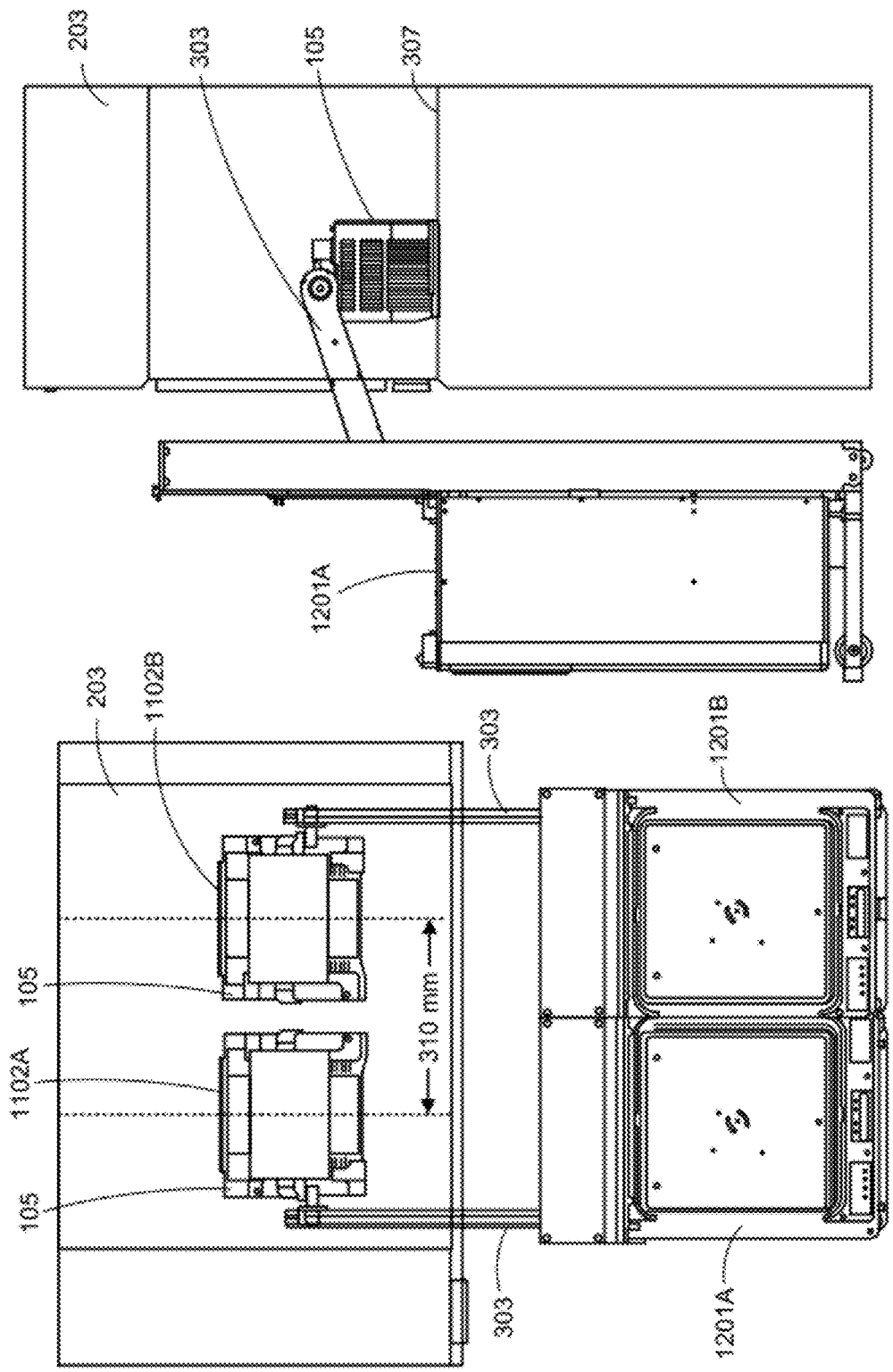

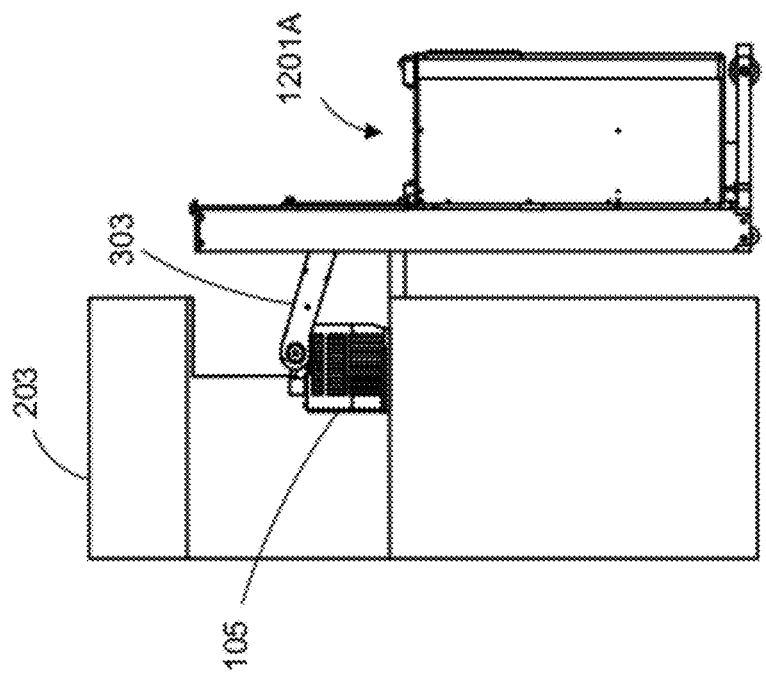
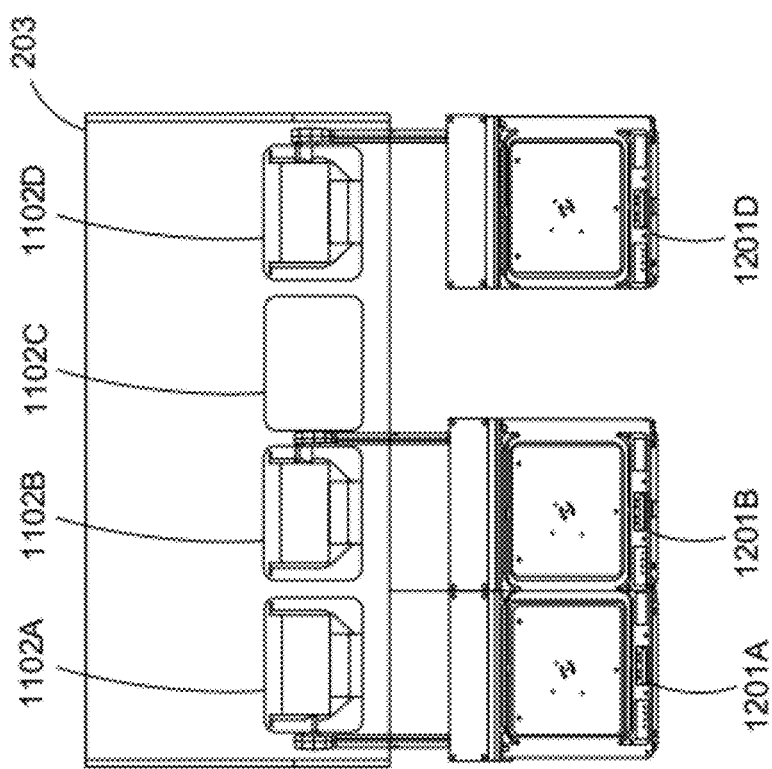
FIG. 16D
FIG. 16C

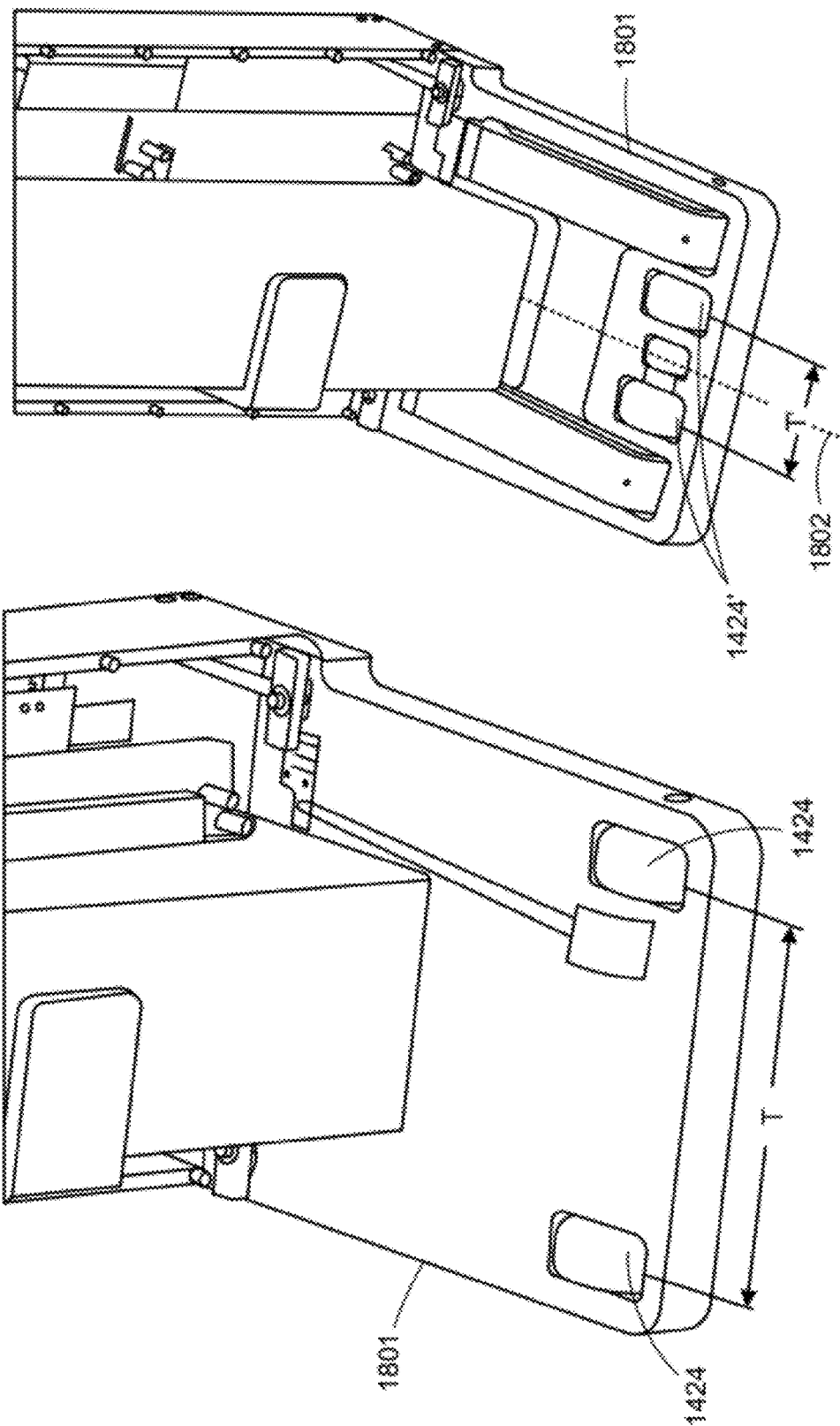

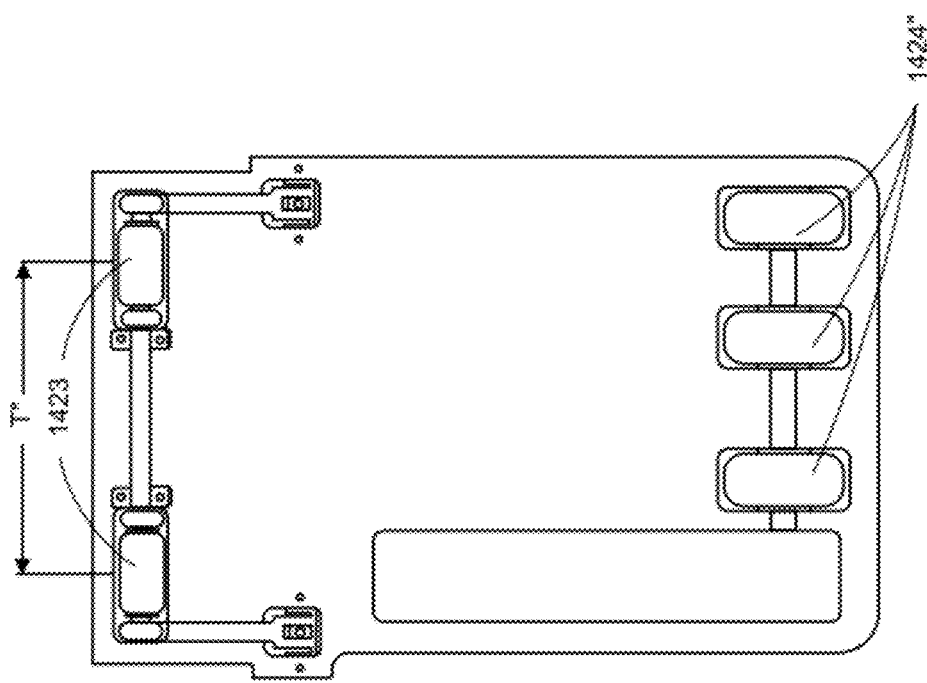

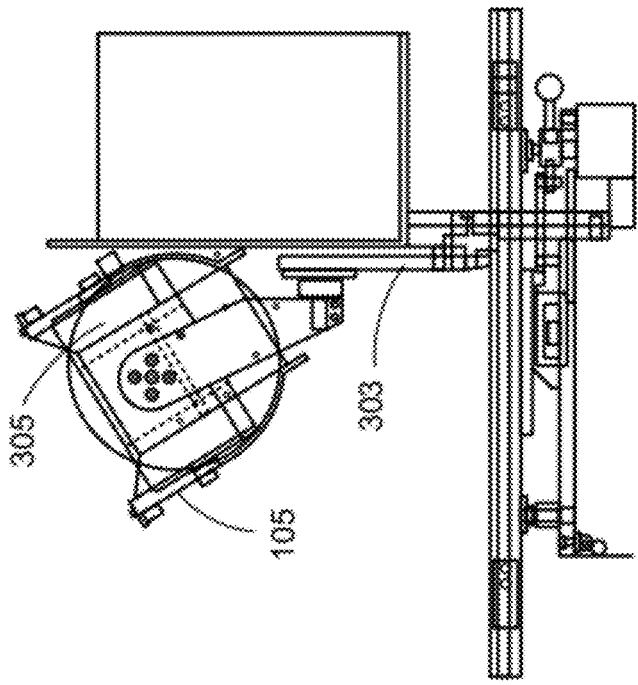
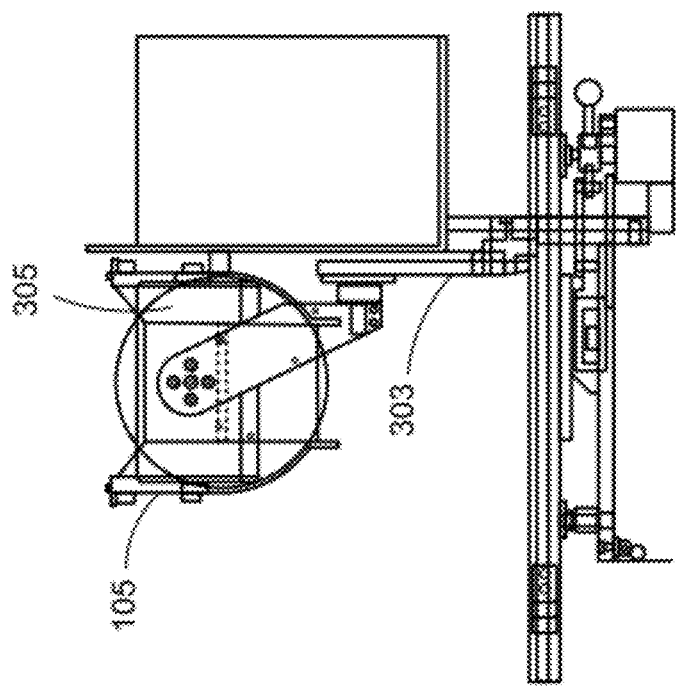
FIG. 20B
FIG. 20A

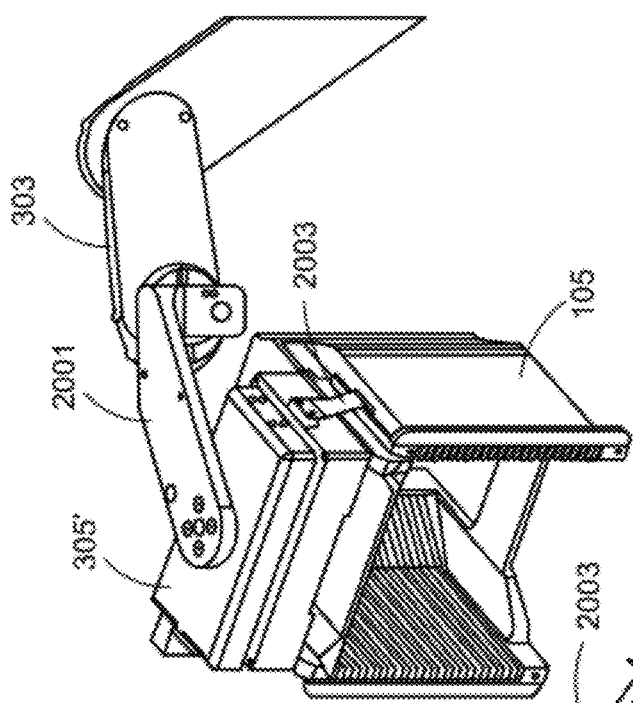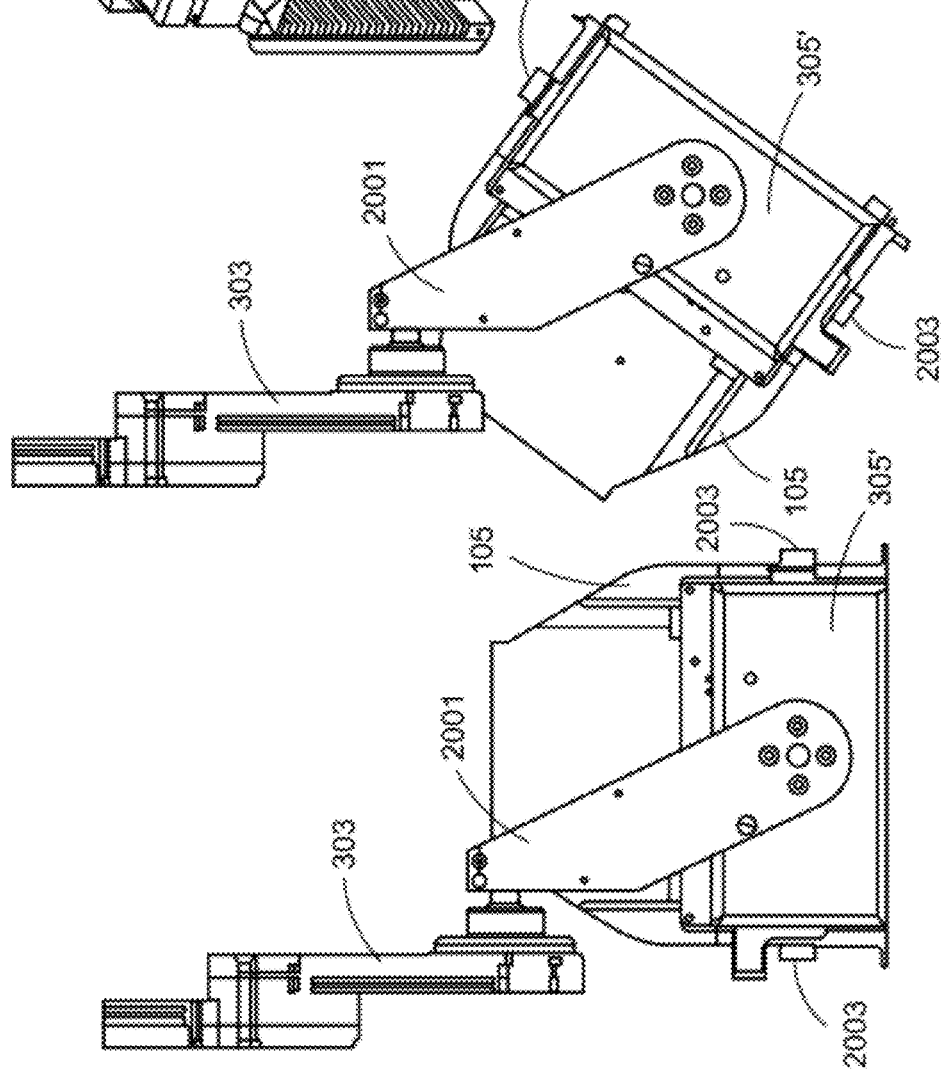
FIG. 20C  FIG. 20D  FIG. 20E

NARROW WIDTH LOADPORT MECHANISM FOR CLEANROOM MATERIAL TRANSFER SYSTEMS

CROSS REFERENCE TO RELATED APPLICATIONS

This application claims priority from U.S. Provisional Patent Application No. 61/483,642 filed on May 6, 2011 and entitled "Narrow Width Loadport Mechanism for Cleanroom Material Transfer Systems," which is incorporated herein by reference in its entirety for all purposes.

BACKGROUND

During semiconductor manufacturing, a semiconductor wafer undergoes a plurality of process steps, each of which are performed by a specialized process tool. Pods are used to convey semiconductor wafers from one tool to another. Each pod is capable of transporting a number of wafers of a specific diameter (e.g. 100-300 mm or larger). The pods are designed to maintain a protected internal environment to keep the wafers free of contamination, e.g., by particulates in the air outside the pod. Pods are also known for conveying other types of substrates, such as reticles, liquid crystal panels, rigid magnetic media for hard disk drives, solar cells, etc.

A loadport transfer device is defined to provide a standard mechanical interface (SMIF) to wafer fabrication production tools (process and/or metrology tools) to enable loading/unloading of pods into/out of wafer fabrication production tools, while ensuring protection of wafers therein from contamination. FIG. 1 shows an articulation schematic of a conventional loadport 10 having a window 12 through which a pod 14 is moved, in accordance with the prior art. The conventional loadport 10 is defined to move the pod 14 through the window 12 in a Y direction, and is defined to move the pod 14 in a Z direction.

SUMMARY

Broadly speaking, the present invention fills these needs by providing a loadport capable of moving the pod in the vertical and horizontal directions. [note needs] It should be appreciated that the present invention can be implemented in numerous ways, including as a process, an apparatus, a system, computer readable media, or a device. Several inventive embodiments of the present invention are described below.

One embodiment provides a loadport system including a frame, an articulating arm, a mini environment and a tower substantially centered in the frame. The tower includes multiple motors, a first motor mechanically coupled to the mini environment for moving the mini environment vertically. A second motor mechanically coupled to the articulating arm for moving the articulating arm vertically. A tower enclosure is also included. The tower enclosure enclosing the motors separate from the mini environment.

The motors can be disposed between the mini environment and a base plate of the loadport, the base plate being coupled to the frame. The mini environment can include a filter assembly and a first fan coupled to the filter assembly for directing air though the filter assembly and into the mini environment. An inner volume of the mini environment can be a class 1 clean room environment. The tower enclosure can include a second fan for drawing air out of the tower enclosure to an external environment. The second fan draws air through the second fan and out of the tower enclosure in a downward direction. The loadport can have a width substantially equal to a width of a substrate cassette location in a process tool.

The motors can include a third motor mechanically coupled to the articulating arm for moving the articulating arm horizontally away from the frame and toward a process tool. The articulating arm can include a gripper assembly. The gripper assembly can be a rotating gripper.

Another embodiment provides a substrate transport system including multiple loadport systems coupled to a process tool, the process tool having multiple substrate cassette locations. Each of the loadport systems includes a frame, an articulating arm, a mini environment and a tower substantially centered in the frame. The tower includes multiple motors. A first one of the motors is mechanically coupled to the mini environment for moving the mini environment vertically. A second one of the motors mechanically coupled to the articulating arm for moving the articulating arm vertically. A tower enclosure is also included. The tower enclosure enclosing the motors separate from the mini environment. Each one of the loadports is aligned with a corresponding one of the substrate cassette locations in the process tool. Each one of the loadports has a width substantially equal to a width of one of the substrate cassette locations.

Yet another embodiment provides a method of transporting substrates including aligning a loadport system with a corresponding one of multiple substrate cassette locations in a process tool. The loadport system including a frame, an articulating arm, a mini environment, a tower substantially centered in the frame. The tower includes multiple motors. A first one of the motors is mechanically coupled to the mini environment for moving the mini environment vertically. A second one of the motors is mechanically coupled to the articulating arm for moving the articulating arm vertically. A tower enclosure is also included in the loadport system. The tower enclosure encloses motors separate from the mini environment.

The loadport system can include multiple loadport systems and aligning the loadport system with one of the substrate cassette locations in a process tool can include aligning each one of the loadport systems with a corresponding one of the substrate cassette locations in the process tool.

The method can also include directing air though the filter assembly and into the mini environment. Air can also be drawn out of the tower enclosure to an external environment. An air pressure in the mini environment can be greater than an air pressure in the tower enclosure. Air can be drawn out of the tower enclosure to the external environment in a downward direction.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 4A shows a Y-Z plane cross-section view of a starting state of the loadport with the cassette placed on the port plate, in accordance with embodiments of the present invention.

FIG. 4B shows a X-Z plane view A-A of the loadport from the transfer side, as referenced in FIG. 6A, in accordance with embodiments of the present invention.

FIG. 7A is a front view of a narrowed loadport (LPTN), in accordance with embodiments of the present invention.

FIG. 7B is front view of a typical loadport (LPT).

FIGS. 13A-14D provide various additional views of the LPTN, in accordance with embodiments of the present invention.

FIGS. 15A-J illustrate various views of two LPTNs in a tandem, side by side configuration, in accordance with embodiments of the present invention.

FIGS. 16A-16D illustrate three LPTNs used in side by side and single configuration, in accordance with embodiments of the present invention.

FIGS. 18A-18C illustrate various configurations of the base plate, in accordance with embodiments of the present invention.

FIGS. 20A-20L illustrate various configurations of the articulating arm and the gripper assemblies, in accordance with embodiments of the present invention.

DETAILED DESCRIPTION

Several exemplary embodiments systems and methods of making and using a loadport capable of moving the pod in the vertical and horizontal directions will now be described. It will be apparent to those skilled in the art that the present invention may be practiced without some or all of the specific details set forth herein.

Figure 1:
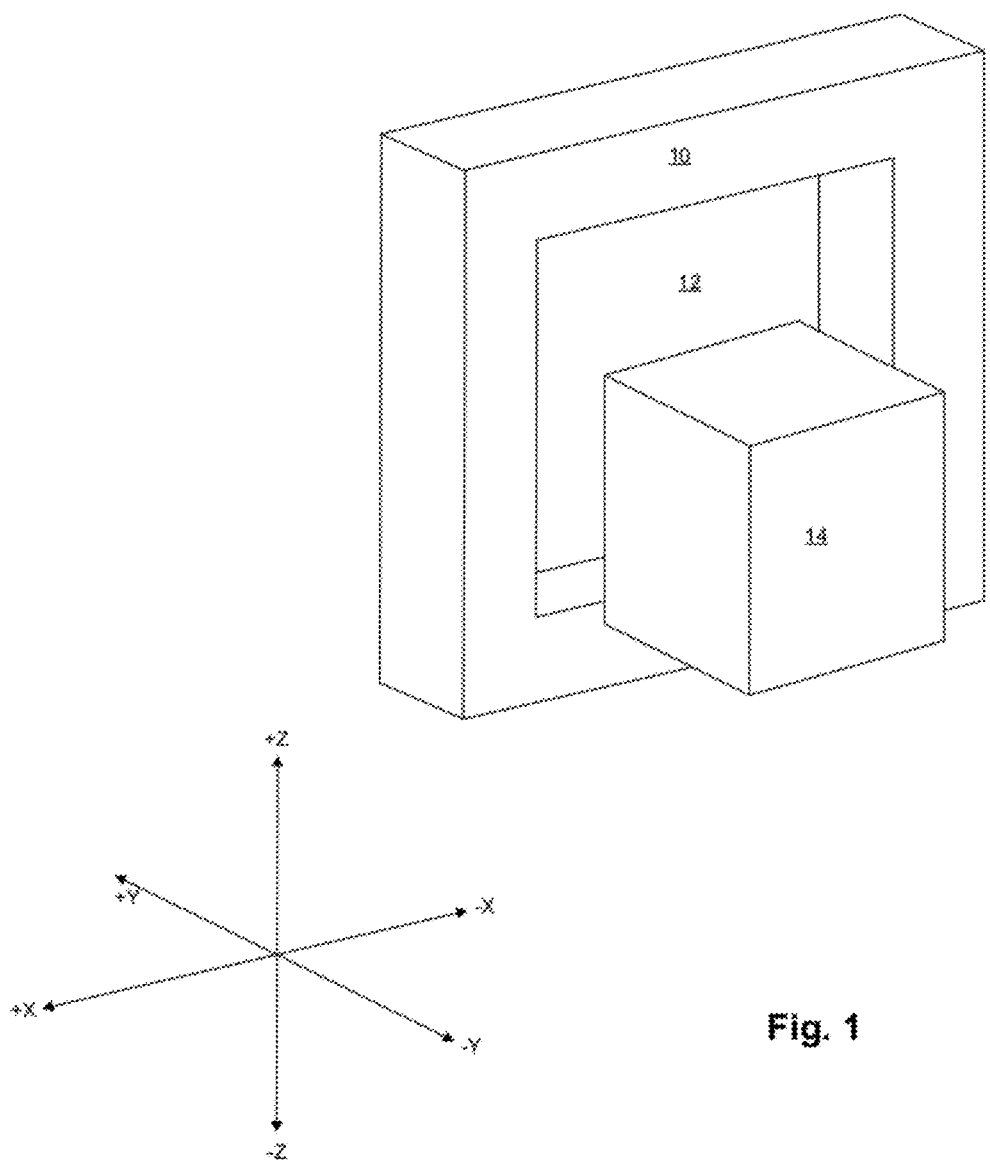
FIG. 1 shows an articulation schematic of a conventional loadport.
Figure 2A:
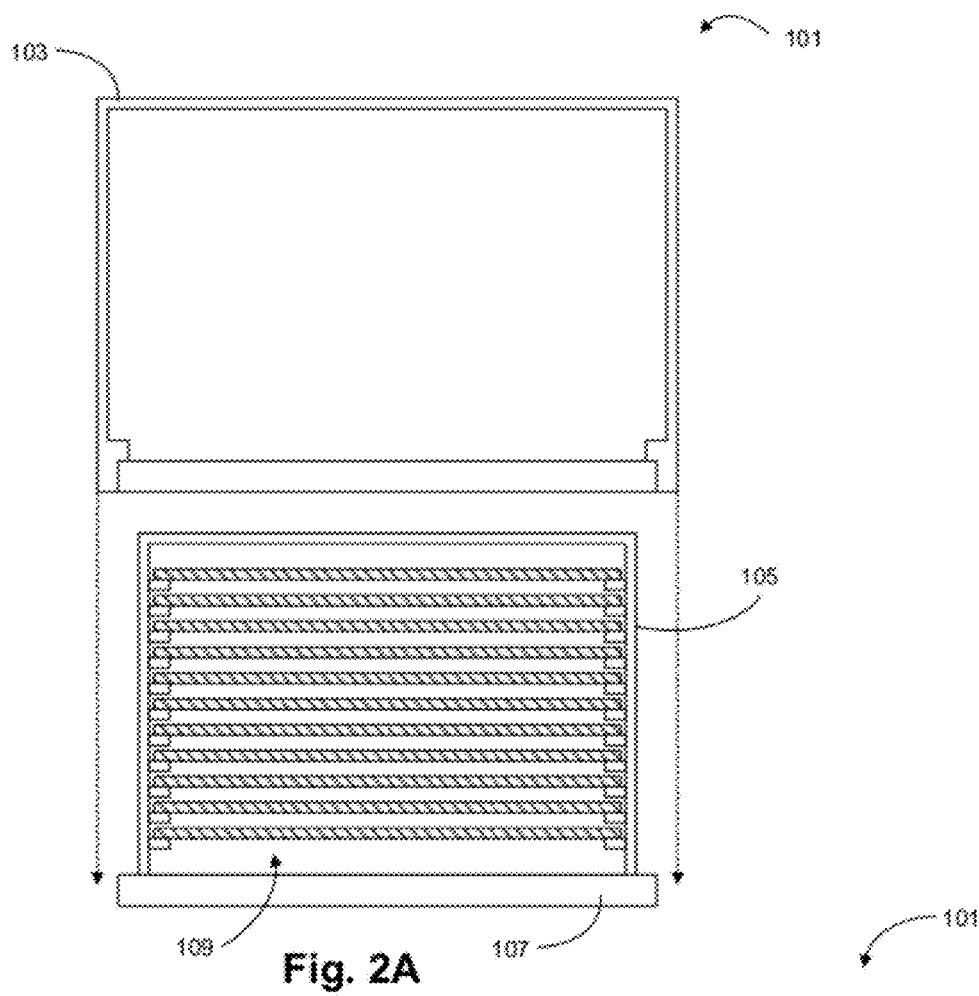
FIG. 2A shows a substrate isolation container in an open state, in accordance with embodiments of the present invention.
Figure 2B:
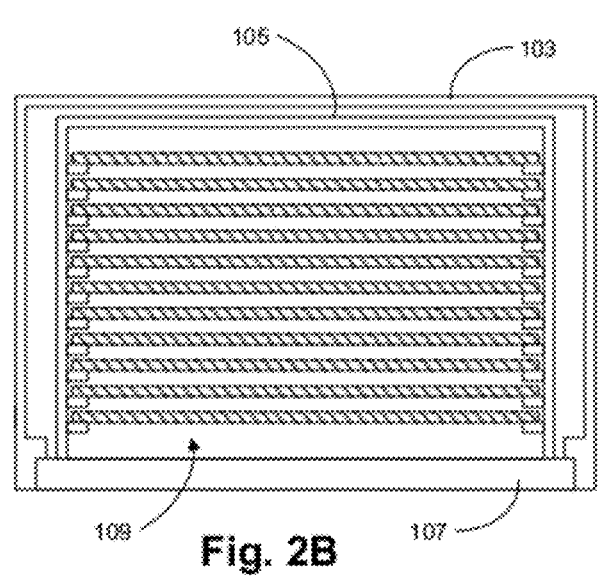
FIG. 2B shows the substrate isolation container in a closed state, in accordance with embodiments of the present invention.

FIG. 2A shows a substrate isolation container 101 in an open state, in accordance with embodiments of the present invention. The shell 103 of the substrate isolation container 101 is lifted away from the cassette 105 in the open configuration. FIG. 2B shows the substrate isolation container in a closed state, in accordance with embodiments of the present invention. The shell 103 of the substrate isolation container 101 is placed over the cassette 105 and locked to the bottom door 107 in the closed configuration. The substrate isolation container 101 is defined to hold multiple substrates 109 in a secure manner while protecting the substrates 109 from contamination present outside of the substrate isolation container 101. The substrate 109 can represent any type of article formed through the semiconductor fabrication process. For example, the substrate 109 may represent a semiconductor wafer, a flat panel display, a solar panel, among many others. For ease of description, the term substrate is used herein to refer to any type of article to be received into or retrieved from a semiconductor fabrication process tool or metrology tool.

The substrate isolation container 101 can be a standard mechanical interface (SMIF) pod including a cassette 105 within which the substrates 109 are held, a bottom door 107 to which the cassette 105 is connected, and a shell 103 defined to cover the cassette 105 and connect with the bottom door 107.

Figure 3A:
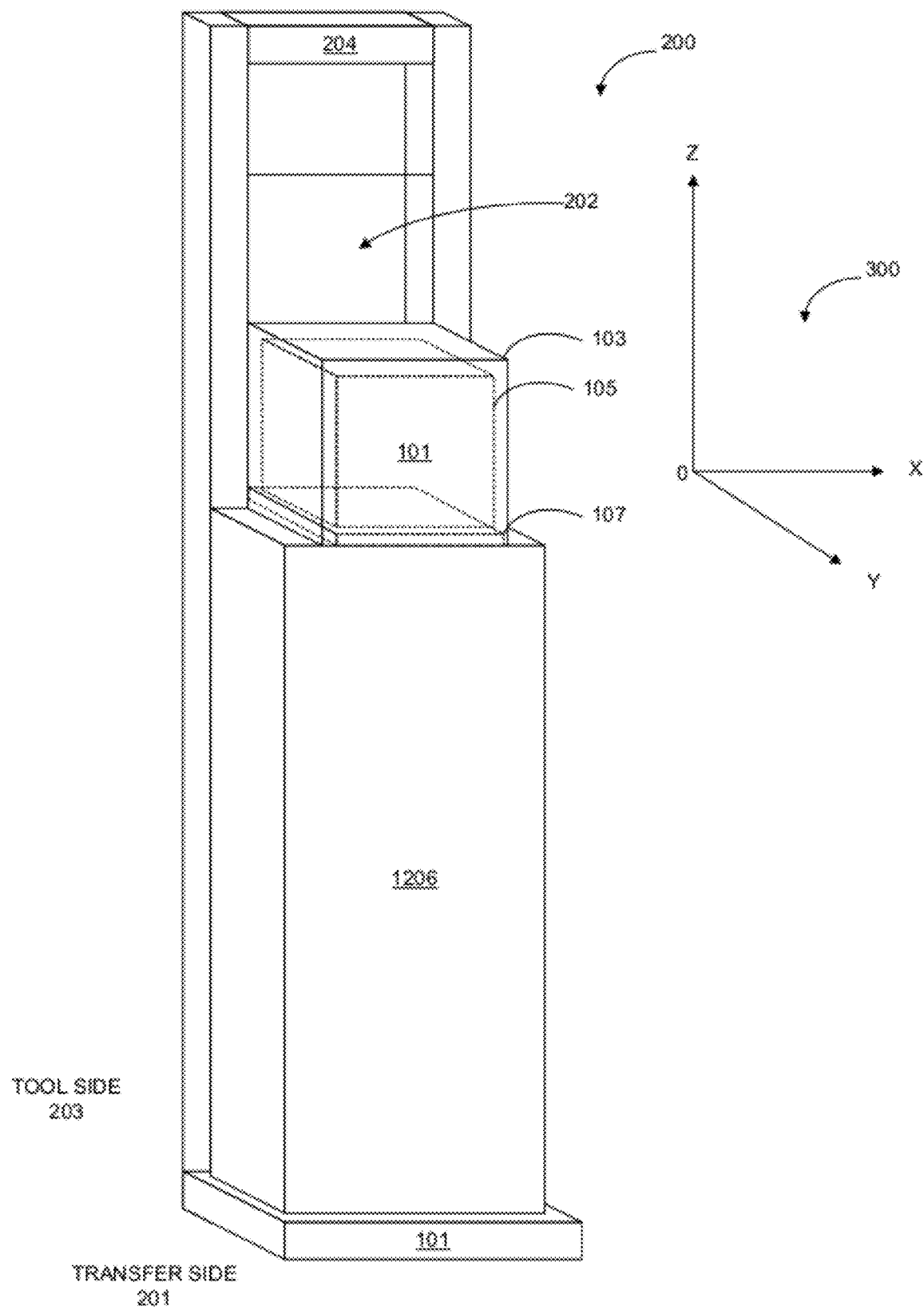
FIG. 3A shows an isometric view of the loadport, in accordance with embodiments of the present invention.
Figure 3B:
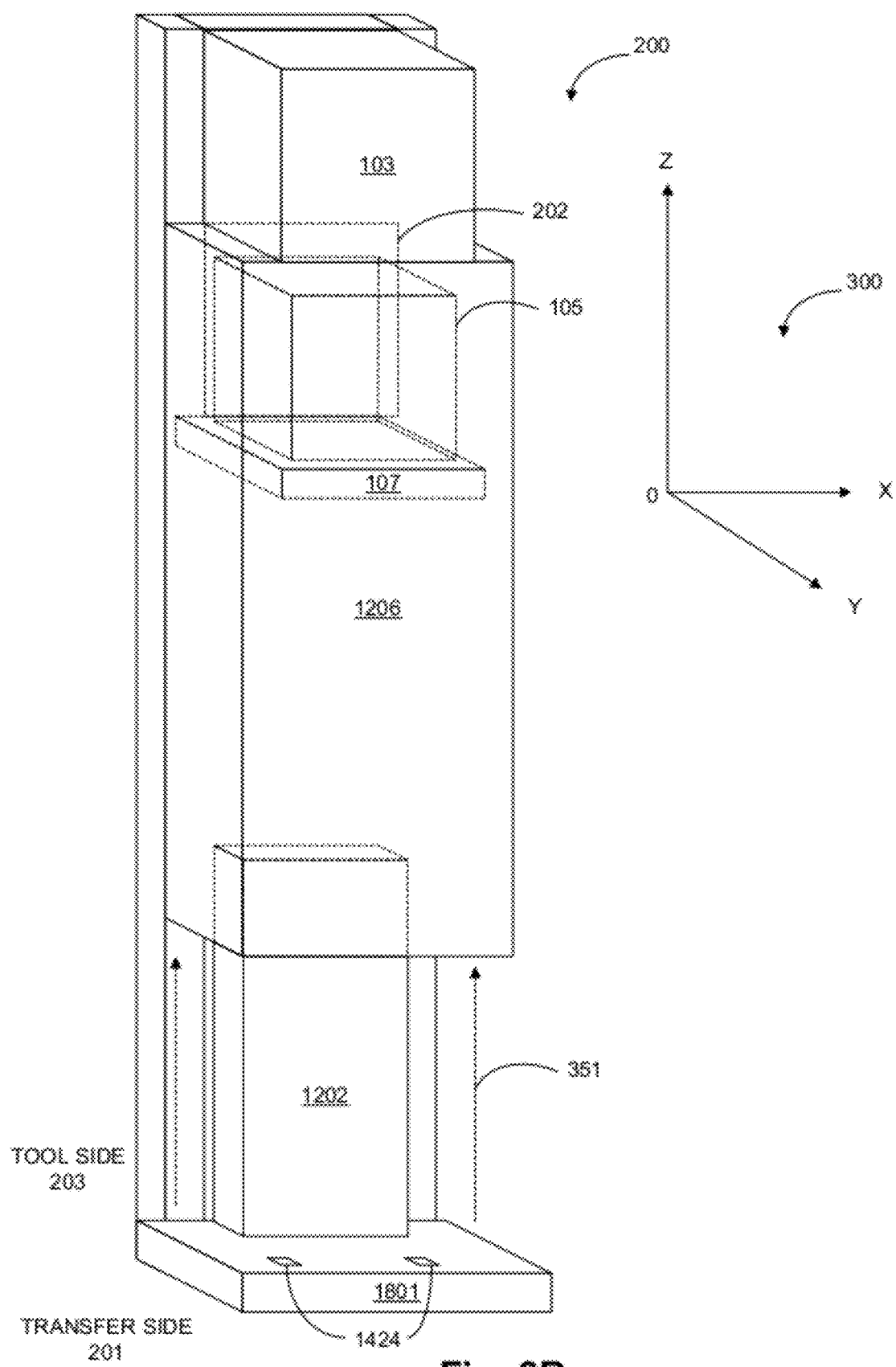
FIG. 3B shows a loadport, in accordance with embodiments of the present invention.
Figure 3C:
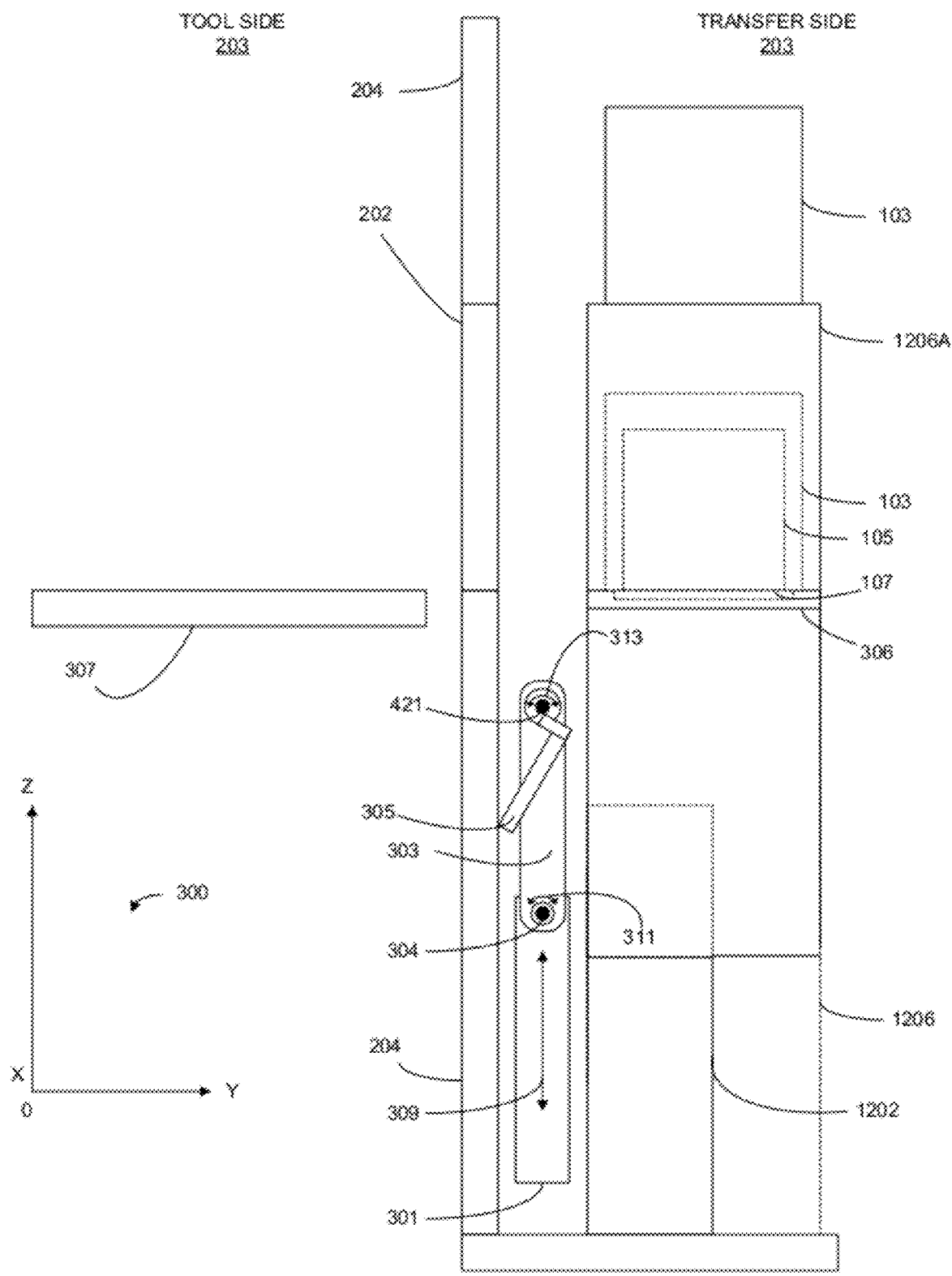
FIG. 3C shows side view of the loadport 200 in the open configuration, in accordance with embodiments of the present invention.

FIG. 3A shows an isometric view of the loadport 200, in accordance with embodiments of the present invention. FIG. 3B shows a loadport 200, in accordance with embodiments of the present invention. The loadport 200 is shown with the mini environment 1206 in the lowered configuration in FIG. 3A and a raised configuration, raised in direction 351 in FIG. 3B. Raising the mini environment 1206 also raises the outer shell 103 of the substrate isolation container 101. Raising the mini environment 1206 also places the cassette 105 inside the mini environment to allow access to the cassette 105 by the process tool. When the mini environment is raised, a portion of the central tower 1202 can be seen. FIG. 3C shows side view of the loadport 200 in the open configuration, in accordance with embodiments of the present invention. The loadport 200 provides a standard mechanical interface to wafer fabrication production tools, such as process and/or metrology tools, to enable loading of the cassette 105 from a transfer side 201 of the loadport 200 to a tool side 203 of the loadport 200 and to enable unloading of the cassette 105 from the tool side 203 of the loadport 200 to the transfer side 201 of the loadport 200. It should be noted that the cassette 105 is shown with the enclosure 103 previously removed to simplify the following description.

The loadport 200 includes an isolation plate 204 that separates the transfer side 201 from the tool side 203. The isolation plate 204 includes a window 202. A retractable closure (not shown) can cover the window 202 when the loadport 200 is not conducting cassette 105 transfer operations. The retractable closure can uncover (e.g., open) the window 202 during cassette 105 transfer operations. For ease of discussion, the window 202 as depicted in FIG. 3A is considered to be open to enable cassette 105 transfer operations. The loadport 200 moves the cassette 105 from a port plate 306, through the window 202, to a tool side stage 307, vice-versa as described in more detail below.

The loadport 200 includes an articulating arm 303 for moving within a vertical plane oriented perpendicular to the window 200. As shown in FIG. 3A, the vertical plane is the Y-Z plane as reference by coordinate axes 300. It should be understood that the X direction of the coordinate axes 300 extends through the origin O perpendicular to both the Y and Z axes, i.e., the X direction extends perpendicularly through the paper upon which FIG. 3A is printed.

Figure 4C:
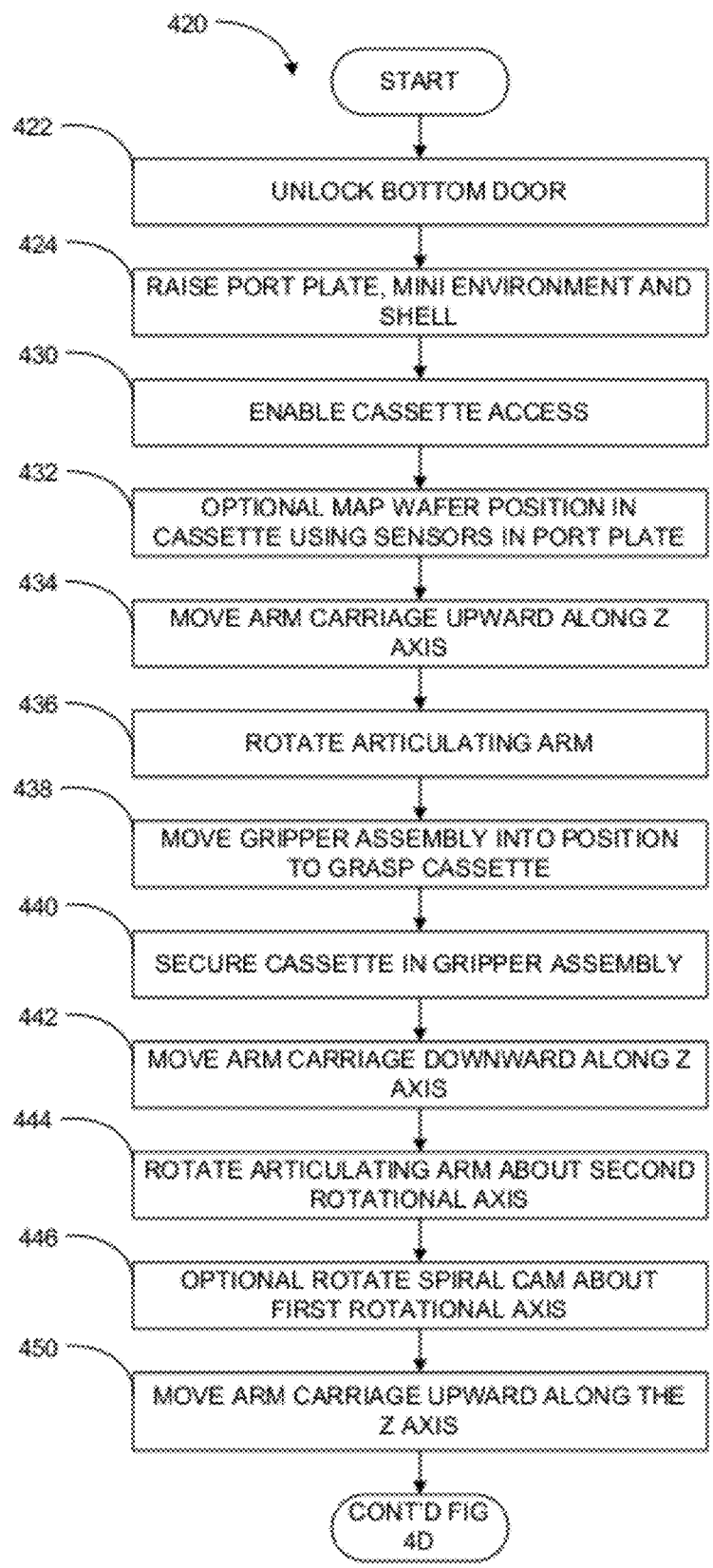
FIGS. 4C and 4D are a flowchart diagram that illustrates the method operations performed in moving the cassette from the transfer side to the tool side of the loadport, in accordance with embodiments of the present invention.
Figure 4D:
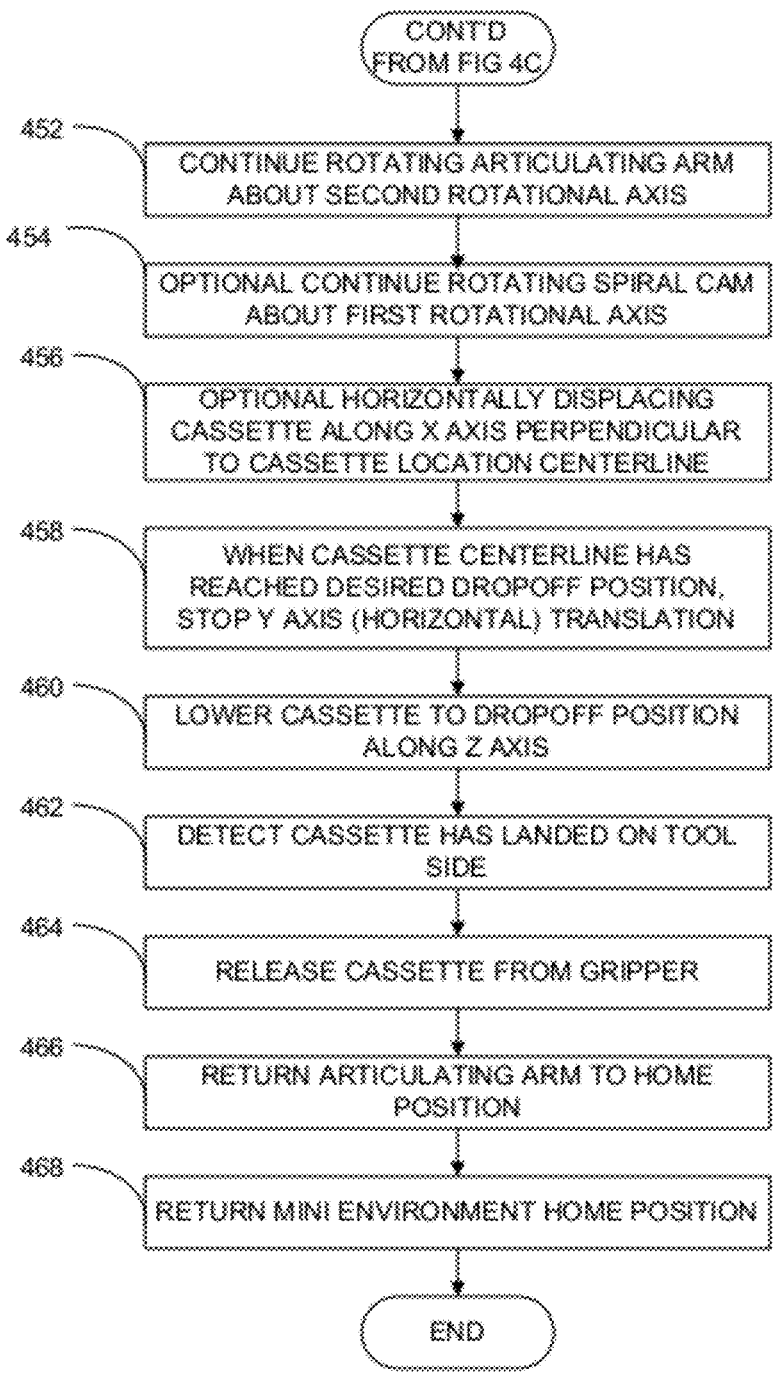
Figure 5:
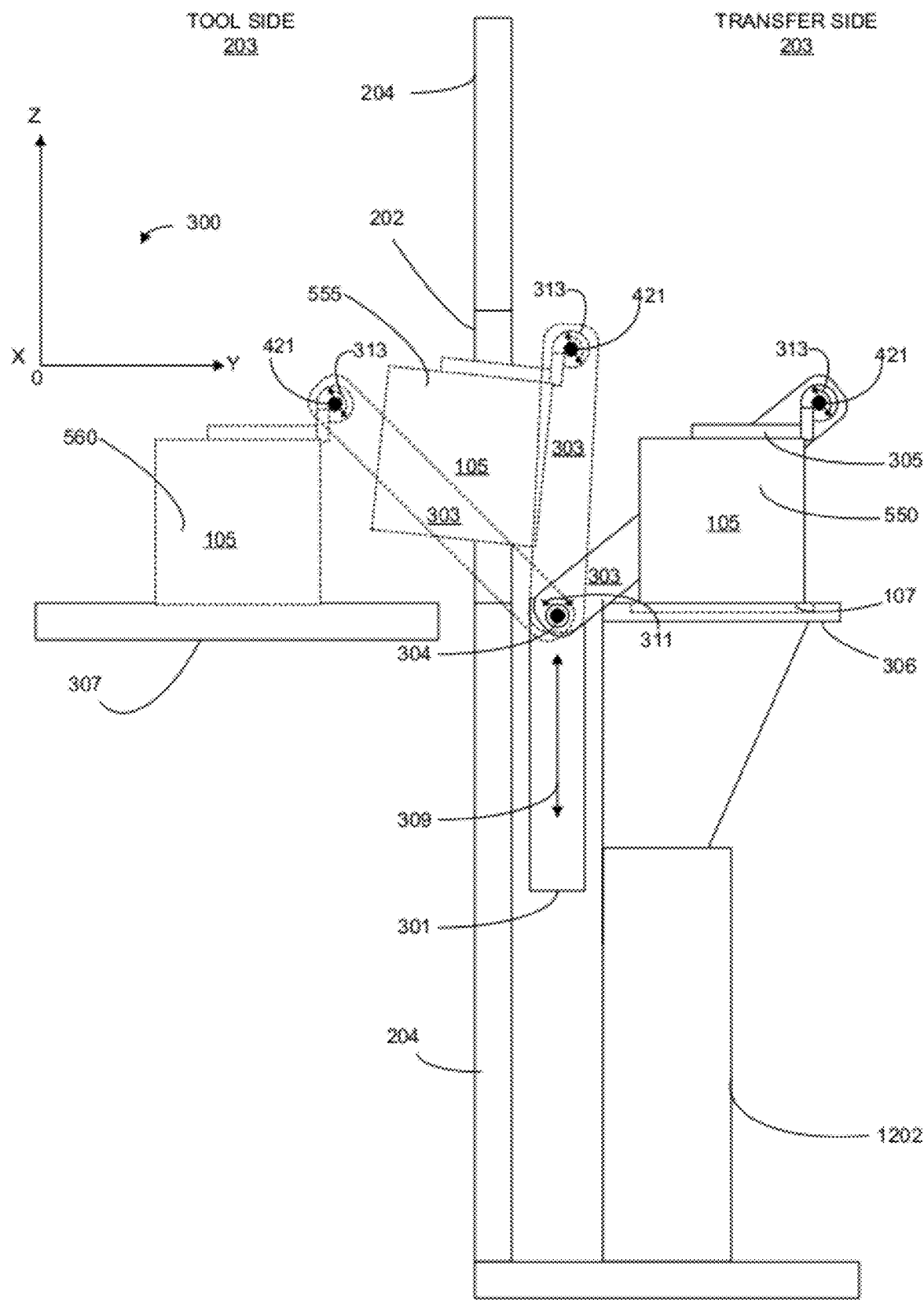
FIG. 5 shows a Y-Z plane cross-section view of the loadport 200 moving to grasp the cassette 105 on the port plate 306, in accordance with embodiments of the present invention.

FIGS. 4A through 5 show a sequence of loadport 200 operations for moving the cassette 105 from the port plate 306 to the tool side stage 307. FIG. 4A shows a Y-Z plane cross-section view of a starting state of the loadport 200 with the cassette 105 placed on the port plate 306, in accordance with embodiments of the present invention. The arm carriage 301 and articulating arm 303 connected thereto are shown retracted downward along the Z axis into the loadport 200.

FIG. 4B shows a X-Z plane view A-A of the loadport 200 from the transfer side 201, as referenced in FIG. 6A, in accordance with embodiments of the present invention. The cassette 105 placed on the port plate 306 is approximately centered upon a centerline 601 of the loadport 200. The loadport can be offset slightly to one side of the centerline 602 to allow human or mechanical means to access the cassette 105.

FIGS. 4C and 4D are a flowchart diagram that illustrates the method operations 420 performed in moving the cassette from the transfer side 201 to the tool side 203 of the loadport 200, in accordance with embodiments of the present invention. The operations illustrated herein are by way of example, as it should be understood that some operations may have sub-operations and in other instances, certain operations described herein may not be included in the illustrated operations. With this in mind, the method and operations 420 will now be described with reference to FIG. 5.

FIG. 5 shows a Y-Z plane cross-section view of the loadport 200 moving to grasp the cassette 105 on the port plate 306, in accordance with embodiments of the present invention. The loadport is shown in FIG. 5 in the open configuration with the mini environment 1206 and the shell 107 fully removed to aid in clarity of discussion. It should be understood that the mini environment 1206 is actually still present during the following operations. In an operation 422, the bottom door 107 of the substrate isolation container 101 is unlocked. The bottom door 107 can be unlocked by manual operation of by an automated unlocking system (not shown) that is included in the loadport. In an operation 424, the mini environment 1206 and the port plate 306 are raised to raise the shell 107 as described above in FIGS. 2A-3C, thus enabling access to the substrates 109 in the cassette 105 in an operation 430. In an optional operation 432, the location of the substrates 109 and/or the cassette are mapped. Mapping the substrate 109 location of the cassette location can be accomplished by optical and other sensors included in the loadport or in the process tool side 203.

In an operation 434, the arm carriage 301 is moved vertically upward along the Z axis in a controlled manner, as indicated by arrow 309. The articulating arm 303 is rotated in a controlled manner about the second rotational axis 304, as indicated by arrow 303, in an operation 436. In an operation 438, the gripper assembly 305 is moved into position as shown with the articulated arm in position 550. In an operation 440, the cassette is secured in the gripper assembly using the gripper latches 2003 as described in more detail below. In an operation 442, the arm carriage 301 and the articulated arm assembly is moved downward along the Z axis while the articulated arm 303 is rotated about the second rotation axis 304. The arm carriage 301 and the articulated arm assembly is moved downward along the Z axis to provide vertical clearance to move the cassette 105 and gripper assembly 305 through the window 202 as shown in position 555. In an optional operation 446, the spiral cam 401 is rotated in a controlled manner about the first rotational axis 421, as indicated by arrow 705. In an operation 450, the arm carriage 301 and the articulated arm assembly is moved upward along the Z axis to increase the range of motion of the articulated arm 303 in the tool side 203.

Included in the operations 442-446 above, the articulating arm 303 and the optional spiral cam 401 may optionally be rotated in a coordinated manner so as to secure the substrates within the cassette 105 in position 555. By way of example, the cassette 105 may be angled relative to the Y axis such that the substrates cannot slide out of the cassette 105 as the cassette 105 is transported from the transfer side 201 to the tool side 203. The cassette 105 may be angled at an angle θ. Angle θ can be between a very narrow angle (e.g., less than about 10 degrees) or as much as fully perpendicular to the Y axis.

In an operation 452 the articulating arm 303 is further rotated about the second rotational axis 304 to extend the articulated arm into the tool side 203. Optionally, the spiral cam can also be rotated in an operation 454 as the articulating arm 303 is further rotated about the second rotational axis 304 to maintain the desired angle θ.

For one reason or another, (e.g., width of the loadports 200A-200D) it may not be possible to place the loadports 200A-200D in relative alignment to the centerlines of the corresponding tool side stages. In an optional operation 456, the cassette is displaced horizontally along the X axis, perpendicular to the cassette location centerline on the tool side 203. Optional operation 456 can occur simultaneously with one or more of the above operations 442-454.

By way of example, if the centerline of the loadport is aligned with the centerline of the tool side stage. Therefore, horizontal displacement of the cassette along the X axis as it is moved between the loadport and the tool side stage is not necessary. In this case, the loadport can be equipped with a gripper assembly 305 directly connected to the rotatable shaft 419.

The loadport can be equipped with a right-handed spiral cam apparatus 400 to provide for horizontal displacement of the cassette to the left along the X axis, as it is moved between the loadport and the tool side stage 307. The loadport can be equipped with a right-handed spiral cam apparatus to provide for horizontal displacement of the cassette to the left along the X axis, as it is moved between the loadport and the tool side stage 307. The loadport can be equipped with a left-handed spiral cam apparatus to provide for horizontal displacement of the cassette to the right along the X axis as it is moved between the loadport and the tool side stage. Considering the above example, it should be appreciated that use of the spiral cam apparatus 400 can significantly improve efficiency in fabrication facility floor planning and space utilization.

In an operation 458, the articulating arm 303 continues to rotate in a controlled manner about the second rotational axis 304, as indicated by arrow 313 and the optional spiral cam 401 can continue to rotate in a controlled manner about the first rotational axis 421, as indicated by arrow 313, until the cassette 105 has reached the desired drop off position stop along the Y Axis. In an operation 460, the cassette 105 is lowered into the drop off position until the cassette has been detected on the tool side 203 stage 307 in an operation 462. The gripper 305 releases the latches 2003 to release the cassette 105 in an operation 464. In an operation 466 the articulating arm 303 can return to a home position. In an operation 468, the mini environment 1206 returns to a home (e.g., lowered) position and the method operations can then end.

Narrower Loadport (LPTN)

Figure 6:
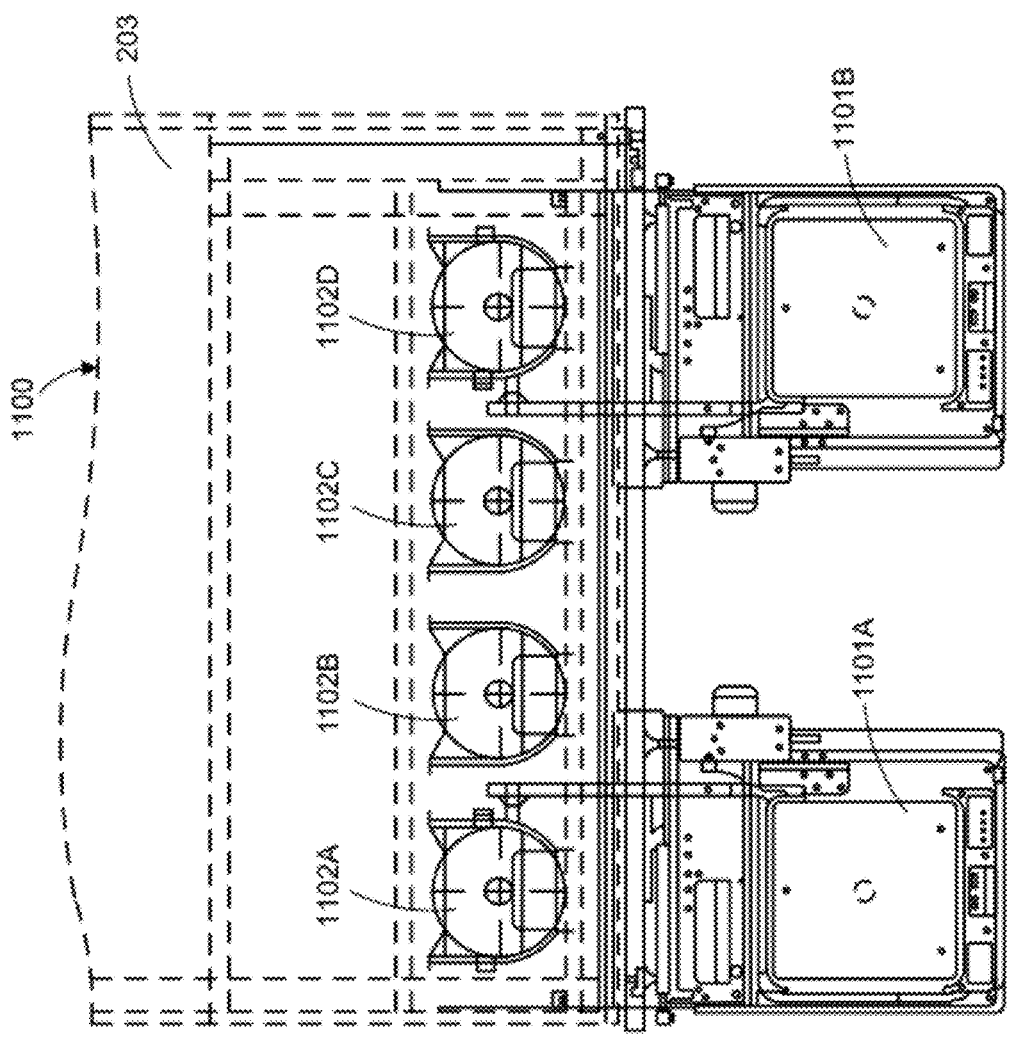
FIG. 6 shows two typical loadports in a tandem arrangement with a multiple loadlocks of typical 200 mm open cassette process tool.

FIG. 6 shows two typical loadports 1101A-B in a tandem arrangement with a multiple loadlocks 1102A-D of typical 200 mm open cassette process tool 1100. As discussed above, the typical loadports 1101A-B are too wide to mechanically align with the respective centerlines of many typical 200 mm and smaller, loadlocks 1102A-D on many processing tools.

By way of example, some early process tool loadlocks 1102A-D had narrow chambers openings between 254 mm (10") and 305 mm (12"). Two standard width LPTs 1101A-B mounted side by side have a minimum distance center to center is 355 mm (14 inches). Likewise, many early 200 mm open cassette process tools 1100 have center to center cassette distances of between about 279 mm to about 342 mm (about 11 to about 13.5 inches). Thus, as shown in FIG. 11, there is insufficient space for typical loadports 1101A-B in a side by side configuration on many 200 mm open cassette process tools 1100. This prevents loading/unloading cassettes from all four tracks 1102A-D. As a result, the throughput of the process tool 1100 is substantially restricted and reduced to a less than optimum throughput volume.

The typical LPT 1101A-B for transferring 200 mm cassettes from SMIF-pods to process and metrology tool cassette stations has an overall width that prevents full utilization of tool throughput capacity for tools such as a photoresist track and a vertical furnace that have closely spaced cassettes. The typical LPT 1101A-B has a width of about 430 mm (about 17 inches) and the minimum cassette spacing using a dedicated left/right pair of typical LPTs is about 355 mm (about 14 inches) from centerline to centerline with an overall width for both units of about 860 mm (about 34 inches) or more. The LPTN 1201A can support a cassette-to-cassette centerline spacing of about 245 mm (9.5 inches). The LPTN 1201 is slightly wider (e.g., functionally wider, e.g., about 5-20% wider than the substrate isolation container 101) so as to provide access for human or mechanical means to access and manipulate the substrates within the cassette 105 within the substrate isolation container 101.

Figure 8B:
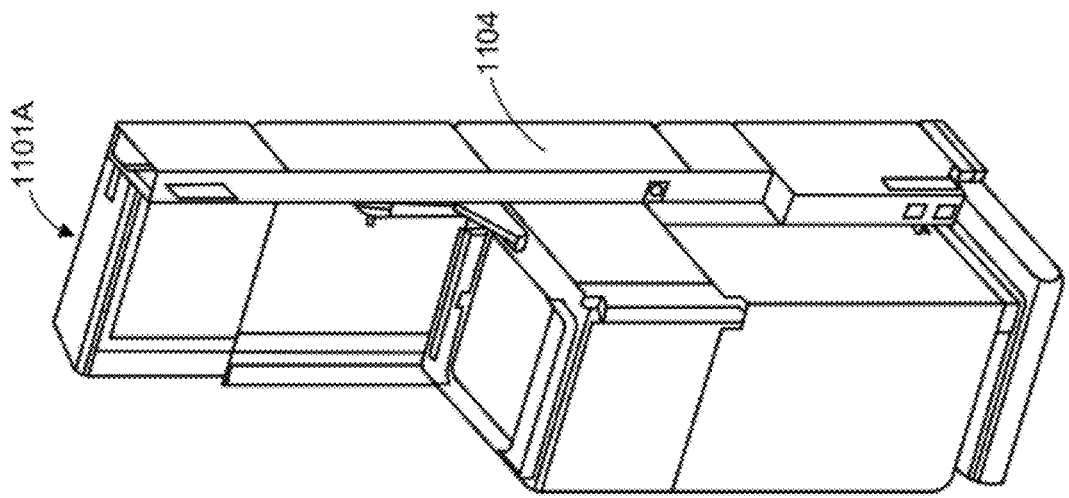
FIG. 8B is a perspective view of a typical loadport (LPT).
Figure 8A:
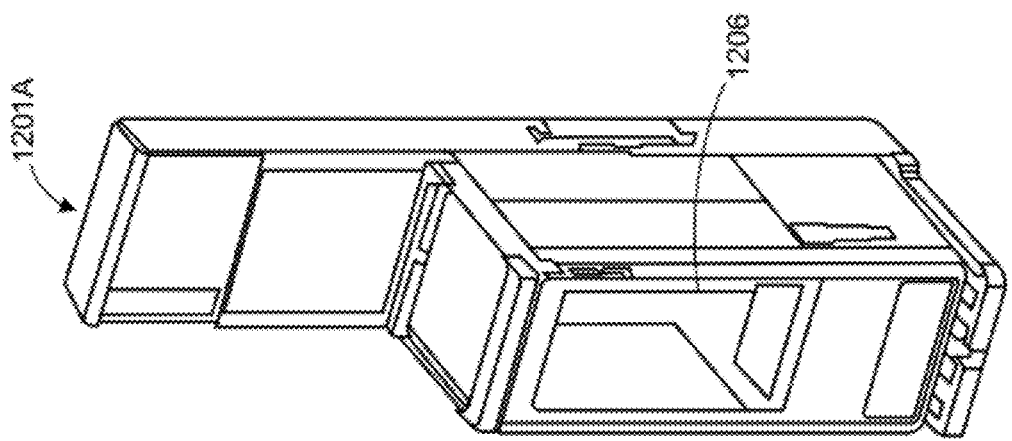
FIG. 8A is a perspective view of a narrowed loadport (LPTN), in accordance with embodiments of the present invention.
Figure 9B:
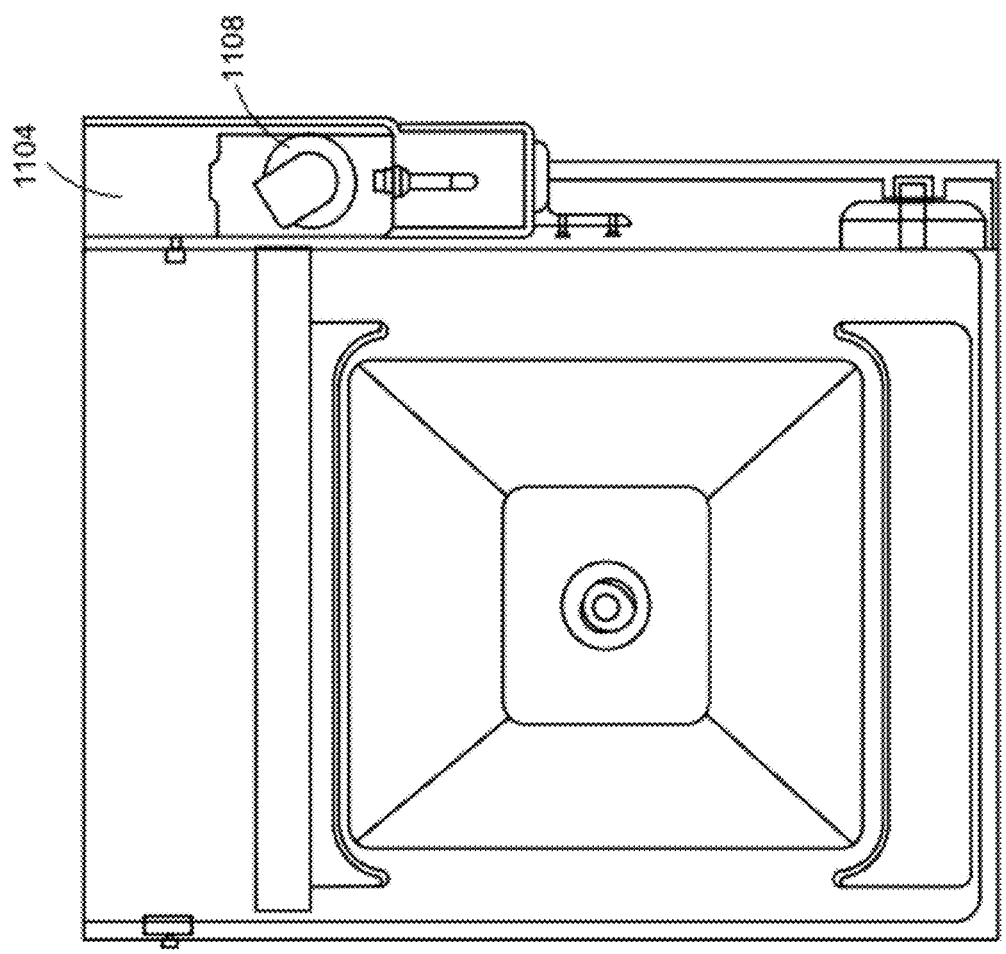
FIG. 9B is top view of a typical loadport (LPT).
Figure 9A:
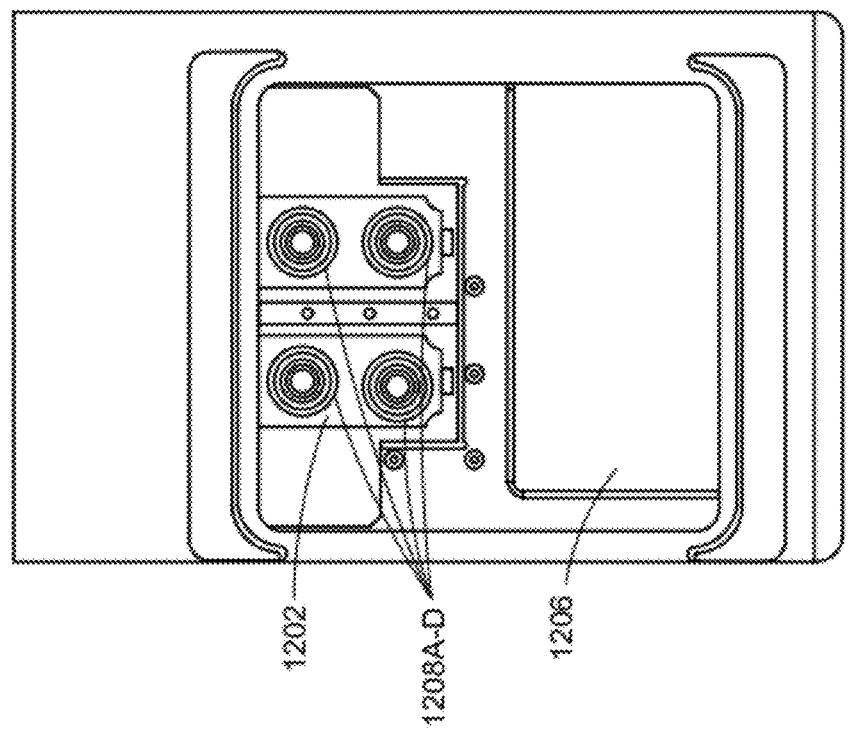
FIG. 9A is a top view of a narrowed loadport (LPTN), in accordance with embodiments of the present invention.

FIG. 7A is a front view of a narrowed loadport (LPTN) 1201A, in accordance with embodiments of the present invention. FIG. 7B is front view of a typical loadport (LPT) 1101A. FIG. 8A is a perspective view of a narrowed loadport (LPTN) 1201A, in accordance with embodiments of the present invention. FIG. 8B is a perspective view of a typical loadport (LPT) 1101A. FIG. 9A is a top view of a narrowed loadport (LPTN) 1201A, in accordance with embodiments of the present invention. FIG. 9B is top view of a typical loadport (LPT) 1101A.

FIGS. 10A-11B illustrate additional views of the LPTN 1201A, in accordance with embodiments of the present invention. The LPTN 1201A has relocated the motors and actuating hardware from the side 1104 of the typical loadport 1101A to a tower enclosure 1202 more closely aligned to the centerline of the LPTN. The tower enclosure 1202 is located beneath the port plate 306 and can optionally be closely aligned to the centerline of the loadport. In one embodiment, the tower enclosure 1202 is beneath the plane of the port plate 306 but not necessarily aligned to the centerline of the loadport. The tower enclosure 1202 is enclosed within the mini environment 1206 to reduce the width of the LPTN 1201A and reduce the volume of the mini environment 1206. The port plate 1420 includes an access door 1153 so that the port plate 1420 can lift the shell 103 of the substrate isolation container 101 and allow the bottom door 107 of the substrate isolation container 101 to pass through the door 1153 as the port plate 1420 lifts the shell 103.

The respective width and architectural arrangement of the LPTN 1201A and the typical LPT 1101A is shown for comparison purposes. The typical LPT 1101A has motors and actuating hardware 1104 mounted on the side of the typical LPT. In contrast, the LPTN 1201A has located the motors and actuating hardware to a tower 1202 enclosure more closely aligned to the centerline of the LPTN.

The LPTN 1201A increases the throughput on multi-cassette process tools (e.g., process tool 1100). The LPTN 1201A architecture enables cassette transfer to tools that have multiple load stations (two or more) where the use of a left/right pair of typical LPTs 1101A-B (e.g., as shown in FIG. 11) prevents use of all the loadports 1102A-D.

A typical V-move LPT 1101A loading/unloading cycle time is approximately 55 seconds. The LPTN 1201A architecture also reduces cassette loading/unloading cycle time. The LPTN 1201A architecture substantially eliminates or at least minimizes the need for left/right mirror image LPTs. Left/right mirror image LPTs require differing component configurations and extra component inventory and more complex manufacturing schedule allowances. The LPTN 1201A can use a standard LPT-XR software. The TR unit has its own Teach Pendant w/programmable functions separate from LPTN 1201A.

The LPTN 1201A architecture significantly reduces the loadport width and footprint while maintaining the cleanliness, reliability, and flexibility attributes that have defined the typical LPT 1101A as the tool interface of choice in virtually all 200 mm processing fabs.

The smaller footprint of the LPTN 1201A is achieved by locating the vertical lift assemblies for the cassette transfer mechanisms and the mini environment into a centrally located, sealed tower 1202. The tower 1202 is located beneath the base plate 306 which supports the substrate isolation container 101 (e.g., SMIF-Pod). The tower 1202 may or may not be substantially aligned with a centerline of the loadport 1201A. However, the tower 1202 is contained within the width or footprint (width×depth) of the substrate isolation container 101 and thus this approach enables a loadport width that is 125 mm narrower than the typical loadport 1101A. The LPTN 1201A also includes a height reduction of about 75 mm as compared to the typical loadport 1101A. The LPTN 1201A also has a lower center of gravity that enhances and maintains stability even with smaller footprint.

The mini environment cleanliness is improved due to a smaller mini environment volume and enhanced sealing. The LPTN 1201A also includes full compatibility with many existing options and recent developments of the typical loadport 1101A. The LPTN 1201A can also remain fully compatible with current loadport interface software and control options.

Reliability, service, support for the LPTN 1201 is assured by re-use of many motion control and electro-mechanical components, including servo motors for the mini environment and cassette transfer assemblies, CPU and servo drive electronics and class 1 Fan/ULPA filter assembly.

The LPTN 1201A is also compatible with existing teach pendant (and teaching methodology). The construction materials for LPTN 1201A mini environment, frame, and port plate are also substantially the similar to typical loadports 1101A.

The LPTN 1201A can use many common components with the typical loadport 1101A including a harmonic drive gearbox assembly including gripper tilt and sensor functions, articulating arm 303 with gripper shaft and bearings, gripper assembly 305 including associated clamps, cassette fingers, and cabling, CPU and servo drive electronics plus the indexer board and associated mapping sensors, window 202 and isolation plate 204 with latchkey drive, fan/filter unit for the mini environment, AC power supply, operator control interface/switches on mini environment housing, power rail Z lift components for the transfer arm assembly and the mini environment (e.g., motors, bearings. Etc.). Operating software including profile moves, error detection, tool communication and operator teach pendant and associated control algorithms and diagnostics can also be substantially common between a typical LPT and an LPTN 1201A.

The LPTN 1201A also includes many new innovations not included in the typical LPT 1101A. The LPTN 1201A frame base plate includes wheels/shafts and leveling screws. The frame side plates can be 10 mm thick×100 mm wide aluminum plates. The port plate perimeter frame can include repositioned laser mapper optics. The linear motion tower 1202 includes dual Z drive ball slide and lead screw assemblies and motors 1208A-D in the centerline of the LPTN 1201A. The LPTN 1201A mini environment shell 1206 is somewhat based on current design but the new design of the LPTN allows the mini environment to be narrower and shorter and thus have a significantly smaller volume. The smaller volume mini environment shell 1206 allows increased and simpler control of the mini environment.

The mounting and routing for the linear motion flex cables are also different than in the typical LPT 1101A. The separator panel between the mini environment 1206 and the transfer arm is also updated. The mounting element attaching the gearbox to the Z-drive tower is a new design as the motor locations have been moved from the side of the typical LPT 1101A to the bottom of the LPTN 1201A.

The top cap tie-plate joining the two side rails is also improved. Plex isolation plates are added to the mini environment. A removable access cover for the linear motion tower is included.

All of the above innovations address the need for a smaller footprint loadport. Two side-by-side LPTNs 1201A can remain in the boundaries of a narrow process tools. LPTNs 1201A are able to access some narrow space applications without the need for additional options (e.g., horizontal motion equipment options). The LPTN 1201A reuses many existing major components and provide improved operating speed without wafer vibration. The same kinematic mounting, same operating functions, same options and configurations are also included in the LPTN 1201A. The LPTN 1201A allows both loadports to remain within the footprint boundary of the process tool. Further, LPTN 1201A control is more accessible and less obstructed than with typical LPT 1101A.

LPTN 1201A is configured for ergonomically transferring substrates contained in cassettes. The cassettes, in embodiments are defined for enclosure in standard mechanical interface (SMIF) pods. Generically, a loadport is a port used to transfer semiconductor substrates, or other types of substrates between one environment and another environment. Typically, the environments are between a clean room environment and a more controlled environment near, in, or proximate to a processing tool. A processing tool should be broadly construed to include any processing tool used in the manufacture of an end product.

The end product can include semi-conductor devices, flat-panel devices, radical devices used in photolithography, and can include any size of the substrate. In semi-conductor processing, semiconductor devices are manufactured from silicon substrates, such as wafers. As is well known, the wafers can be defined in various sizes. Typical sizes include 100 mm, 150 mm, 200 mm, 300 mm, 450 mm, etc.

Depending on the size of the substrate, the SMIF pod (e.g., cassette 105) is constructed to contain and support various numbers of substrates, in a stacked orientation inside of the cassette resident inside the SMIF pod. A SMIF pod is configured for automated opening and closing in a fabrication facility (e.g., to enable substrate access and/or cassette access), and can also be moved from place to place within a fabrication facility by a human or mechanical device. When substrates need to be transferred between the SMIF pod (e.g., substrate isolation container 101) and a processing tool, the loadport provides the interface. In a fabrication environment, loadports are connected to tools by way of bolts, interfaces, and other coupling mechanisms. The loadports are configured to receive SMIF pods on a port assembly. The loadport is configured to separate the outer shell of the SMIF pod while retaining the cassette within a mini environment of the loadport. The LPTN 1201A, in accordance with embodiments of the present invention, includes the mini environment structure 1206 that moves vertically along a Z axis while removing the outer shell 103 of the SMIF pod.

Once the mini environment 1206 is in a raised orientation, the articulating arm 303 assembly with a gripper assembly 305 that is part of the LPTN 1201A is configured to access the cassette 105 from the port assembly and move the cassette into an environment of the tool. As noted above, the tool can take on various configurations, depending on the fabrication operations being performed. The tool can be, for instance, an etching system, an equipment front and module (EFEM), a loadlock, a process tool, a deposition tool, a robot, a shelf, a storage staging location, a stocker, a vehicle, metrology tools, or any other fabrication facility destination that receives the cassette from the LPTN 1201A.

Figure 10B:
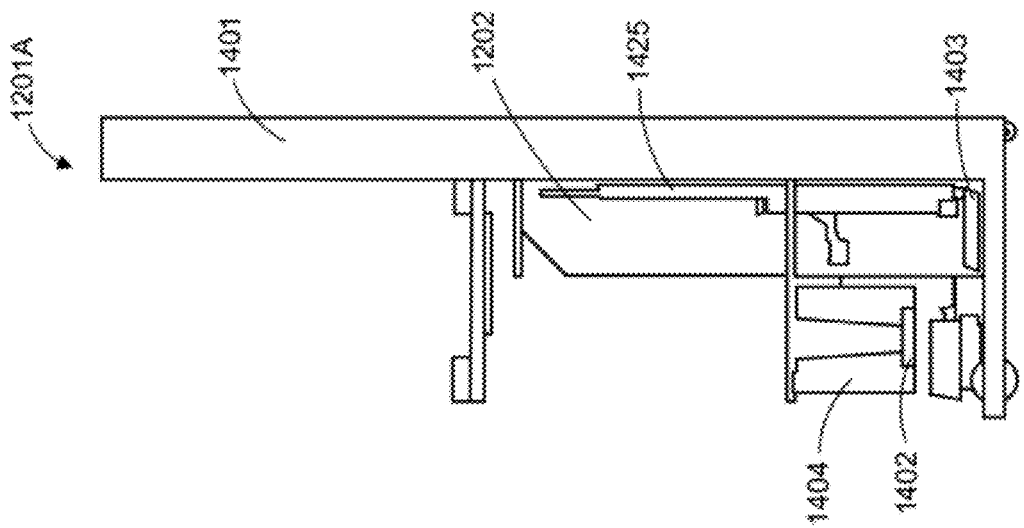
FIGS. 10A-11B illustrate additional views of the LPTN 1201A, in accordance with embodiments of the present invention
Figure 10A:
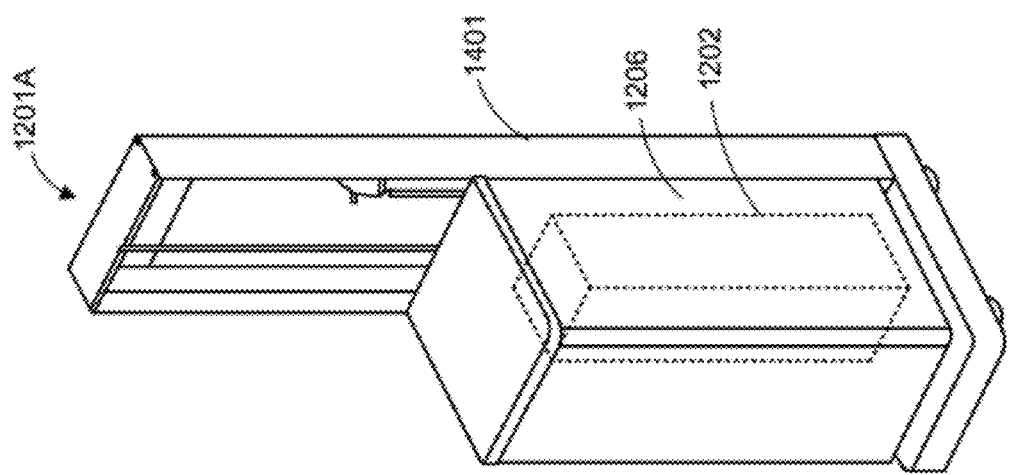

FIG. 10A shows a frame 1401 of the LPTN 1201A, in accordance with embodiments of the present invention. The frame 1401 is configured to be connected to a tool interface. The tool interface can be in the form of a wall, a Box Opener/Loader-to-Tool Standard Interface (BOLTS) structure or similar structure for LPTN 1201A frame 1401, an EFEM interface, or the processing tool itself. The frame 1401 of the LPTN 1201A has a vertical construction near the interface of the LPTN and the tool interface. As shown in FIG. 14A, the LPTN 1201A includes a mini environment shell 1206 that is configured to move in a vertical direction along the Z axis along the frame 1401.

The tower 1202 is enclosed within the mini environment 1206. The tower 1202 can enclose various components of the LPTN 1201A. In one embodiment, located within the tower 1202 is a dual Z drive system that is configured to raise the mini environment 1206 when access to the cassette 105 (and substrates 109 within) is desired, and also provide mechanical motor assistance to a articulated arm 303 that accesses the cassette and delivers the cassette to the process tool. In this embodiment, the drive system is a dual system because it is configured with one system for raising and lowering the mini environment and another system for providing the mechanical assistance to the transfer arm that handles transport of cassettes between the LPTN 1201A and the process tool. The FIG. 10B illustrates a side view of an LPTN frame 1401 without the mini environment shell 1206. The mini environment shell 1206 is not shown to allow viewing of the tower enclosure 1202 which encloses the dual Z drive mechanisms in an isolated region to prevent particle contamination from being exposed near the port assembly where substrates will be present.

In one embodiment, a first fan 1402 is provided connected to a filter assembly 1404 that is contained within the mini environment shell 1206. The first fan 1402 is configured to push air from the clean room in through the fan into the filter assembly 1404 and up in a direction toward the port assembly. The filter assembly 1404 can also move in the vertical direction toward the port assembly along with the mini environment shell 1206. Although not shown, when the mini environment shell 1206 is in the up position, the filter assembly 1404 will be located just below the port assembly, but still contained within the mini environment. As such, clean air is then pushed into the mini environment 1206 where the cassette 105 will be located once the shell 103 of the SMIF pod 101 is raised.

A second fan 1403 is contained within the tower enclosure 1202 near a lower region. The second fan 1403 draws air out of the tower enclosure 1202 where the Z drive mechanisms are located. The second fan 1403 draws air in a vertical direction toward the floor where the LPTN 1201A is configured to sit. As such, the first fan 1402 will draw air into the mini environment 1206 through the filter assembly 1404 in the vertical direction upward, while the second fan 1403 will draw air away from the mini environment 1206 toward the floor and substantially creating a flow of air within the tower enclosure 1202 removing any particulates produced by the motors and driving them away from regions where substrates will be present.

Figure 11A:
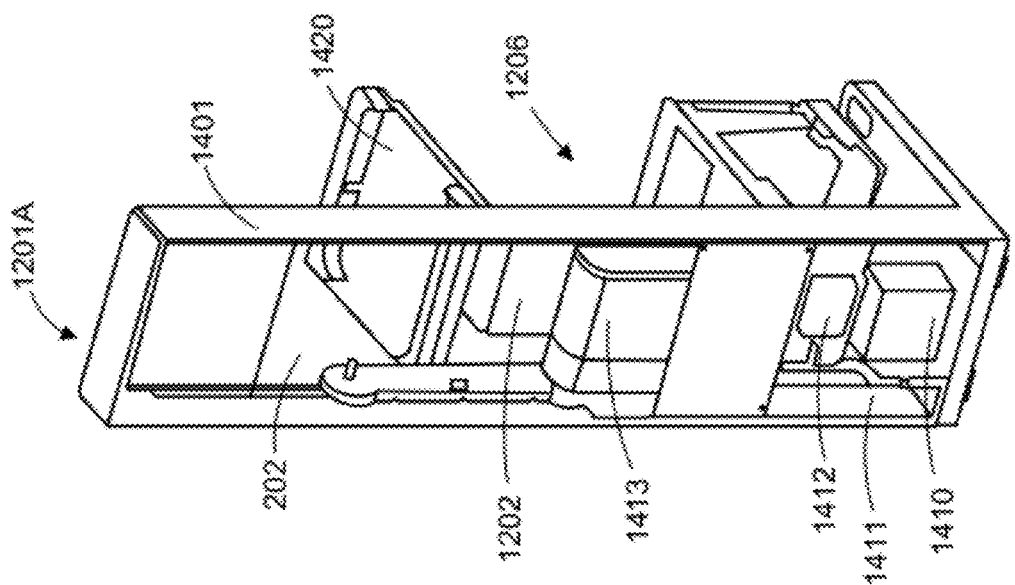

FIG. 11A illustrates another cross-sectional isometric view of the frame 1401 of the LPTN 1201A, in accordance with embodiments of the present invention. This illustration shows the location of an indexer PCB assembly 1415 that is located near the bottom region of the LPTN 1201A. The indexer PCB assembly 1415 includes multiple electronic components that will dictate movement of the LPTN 1201A. As noted above, the movement of the LPTN 1201A includes movement of the mini environment shell 1206 upward and downward along the Z axis depending on the state of operation. Additional coordination provided by the circuitry of the indexer PCB assembly 1415 is to control the movements of the multiple sections of the articulating arm 303 that accesses the cassette 105 and transfers the cassette between the transfer side 201 of the LPTN 1201 and the tool side 203. The filter assembly 1404 is coupled to a portion of the frame 1401 that couples to one of the Z drive motors 1208A.

The filter assembly 1404 can move in the vertical direction between the lower position illustrated in FIG. 11A and an upper position that is just below the window 202. FIG. 11A shows the mini environment shell 1206 removed so as to illustrate components of the LPTN 1201A. In this view, the tower enclosure 1202 is shown located below the port assembly 1420. Locating the Z drive assembly below the port assembly 1420, and in a location that is substantially centered in the frame 1401 of the LPTN 1201A, it is possible to reduce the width of the LPTN to only the frame components. In this embodiment, motors and drives necessary to move the mini environment shell and the transfer arm are no longer coupled to a side frame structure as in typical LPT 1101A, but are now located in a center region of the LPTN 1201A. The center of gravity of the LPTN 1201A can thereby be more centered on the tool structure, preventing possible tendencies of tilt during movements of the LPTN 1201A within a fabrication facility.

Additionally, by placing the drive motors 1208A-D in the center region, covered by the tower enclosure 1202, it is possible to place the moving parts away from the port assembly 1420 where cassettes are to be placed. Additionally, the tower enclosure 1202 having the second fan 1403 can isolate particle generation to a region that is below the port assembly 1420. The typical LPT 1101A places the drive mechanisms on the sidewall and thus the width of the typical LPT 1101A is significantly wider than the LPTN 1201A.

Additionally, having motors and drives on the sidewalls of a typical LPT 1101A, particle generation is also potentially placed in closer proximity to semiconductor substrates when the open cassette 105 is exposed inside the mini environment shell 1206. As noted above, the port assembly 1402 is configured to remain fixed to the LPTN 1201A while the mini environment shell 1206 moves up and down to create the mini environment when in the up position and when the outer shell 103 of the SMIF pod has been opened.

The drive mechanism for the articulating arm 303, although not shown in FIG. 14C in its complete configuration, is also provided with the drive from the motors contained within the tower enclosure 1202 located under the port assembly 1420.

Figure 11B:
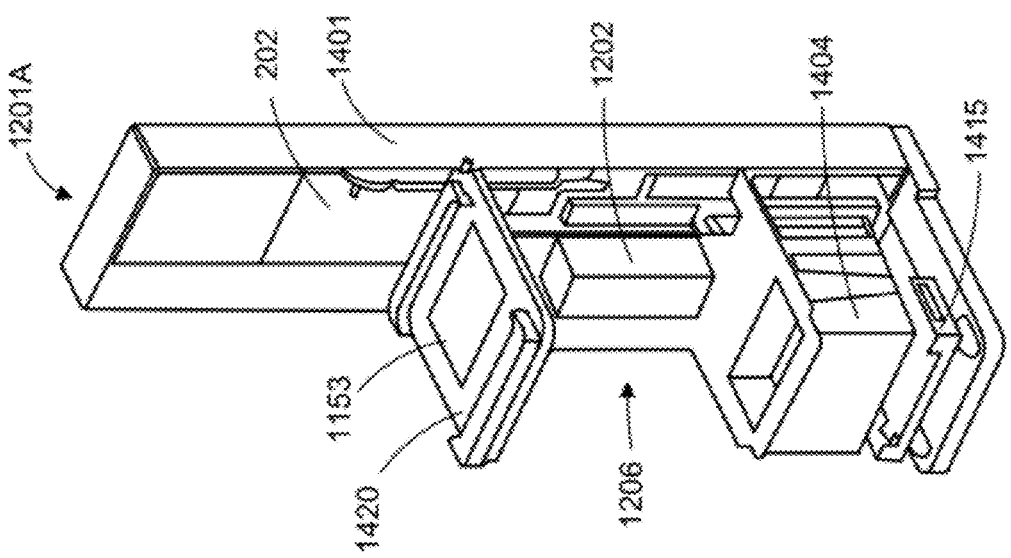

FIG. 11B illustrates an isometric rear view of the LPTN 1201A, when exposed to illustrate components, in accordance with embodiments of the present invention. In this example, the power supply 1410 is shown located in the rear lower section of the LPTN 1410. The I/O board 1411 is also located near the rear lower section where the rear of the LPTN 1201A is the side of the LPTN adjacent to the process tool side 203. The I/O board couples to the indexer PCB assembly 1415 and electronics. The I/O board 1411 typically includes the plugs, and interfaced connections for coupling the LPTN 1201A to a data network, tool interface wiring, connections, power and to provide indicators for diagnostic equipment and to communicate with software during programming or to access software stored on chips, hard drives, memory, storage, or other circuitry and processors located on the LPTN 1201A. In this embodiment, the LPTN 1201A is also provided with data networking interfaces to allow connection of the LPTN to a data network, for determining status, set rules, set programming, said operational parameters, and to retrieve diagnostics associated with use, and service routines. The CPU 1412 is also shown located near the rear lower section of the LPTN 1201A.

The harmonic drive 1413 is located in the midsection of the LPTN 1201A. The harmonic drive 1413 includes driving mechanisms for communicating and directing a vertical orientation of the articulating arm 303, and translating motion information to the articulating arm 303. The motion information is provided to the various segments of the articulating arm 303, including the gripper assembly 305. In one embodiment, multiple pulleys, chains or coupling interfaces are provided to the articulating arm 303 and articulating arm 303 segments through the harmonic drive 1413. The harmonic drive 1413 is in communication with the CPU 1412, so as to define the program motions of the articulating arm 303 and interfacing with the process tool.

Figures 12A, 12B:
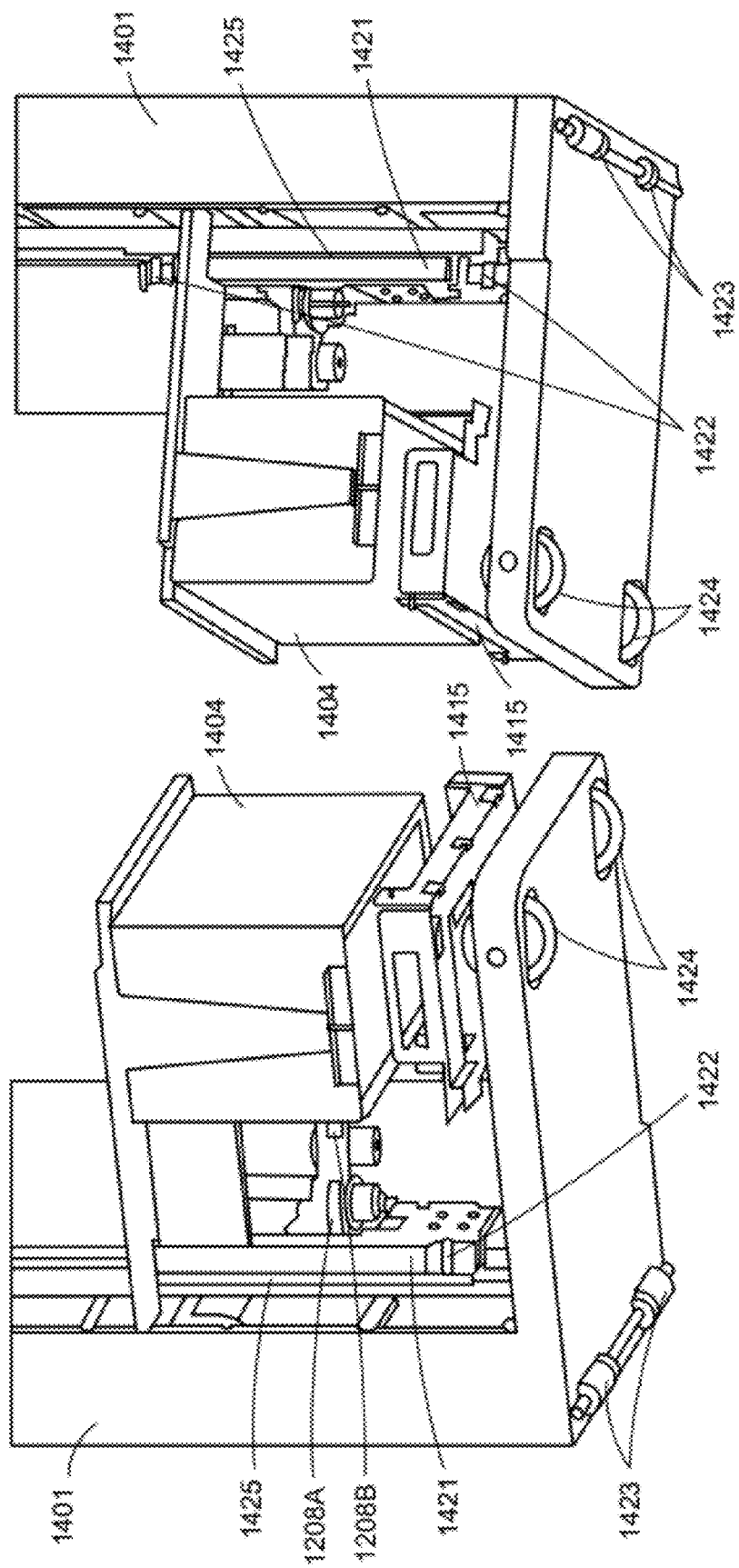
FIGS. 12A and 12B are detailed views of the lower portion of the LPTN, in accordance with embodiments of the present invention.

FIGS. 12A and 12B are detailed views of the lower portion of the LPTN 1201A, in accordance with embodiments of the present invention. FIGS. 13A-14D provide various additional views of the LPTN 1201A, in accordance with embodiments of the present invention. The LPTN 1201A includes a pair of rear wheels 1423 and a pair of front wheels 1424. The placement of the wheels 1423, 1424 can vary, depending on the configuration and as shown in the various figures disclosed herein. The mini environment shell 1206 linear bracket 1421 provides the vertical motion of the filter assembly 1404 when coupled to the mini environment shell 1206 (not shown).

A tape roller seal 1422 seals a path slot 1425 defined in the sidewalls of the mini environment 1206. The path slot 1425 is required to allow the mini environment shell 1206 to be raised and lowered. The tape contains particulates that may be produced within the tower enclosure 1202 and exhausted downward using the second fan 1403.

As there are two motors contained within the tower enclosure 1202, there will be two slots on each side of the tower enclosure 1202. This will allow for the brackets to move up and down to raise and lower the mini environment shell 1206 and also provide the up and down movement of the motor that provides motion for the articulating arm 303.

A first motor 1208A raises and lowers the mini environment shell 1206 and a second motor 1208B raises and lowers the arm carriage 301 and the articulating arm 303. Both motors 1208A, 1208B are placed in the center lower region of the LPTN 1201A inside the tower enclosure 1202. Placing the motors 1208A, 1208B in the center lower region of the LPTN 1201A lowers and centers the center the gravity of the LPTN. This lower, more centered center of gravity of the LPTN 1201A provides additional stability and thus prevents accidental tipping of the LPTN during movement within a fabrication facility.

When the mini environment shell 1206 is in a raised position 1206' as shown in FIG. 14B, the SMIF pod shell 103 is also raised to a raised position 103', exposing the cassette 105 and wafers contained within the mini environment. The filter assembly 1404 can be connected to the lower portion of the mini environment shell 1206 and can be raised in conjunction with the mini environment shell. When the mini environment shell 1206 is raised, and the cassette 105 will be exposed, but the filter assembly 1404 will be pushing clean, filtered air in a vertical direction from below and adjacent to the port assembly 1420, while the open cassette 105 is present in the mini environment shell 1206 and while the articulating arm 303 and the gripper assembly 305 accesses the cassette 105 for movement into the process tool.

Process tools are often configured to receive multiple cassettes 105 in line. The multiple cassettes 105 can be delivered by multiple typical LPTs 1101A connected side-by-side to the front face of a specific process tool. However, as described above, if the typical LPT 1101A is too wide (e.g., not sufficiently narrow) and due to the mechanisms mounted on the typical LPT side frame will not allow the maximum number of typical LPTs to be connected to the process tool. In one specific example, a process tool can be configured to have four tool side stages 307 so as to be able to receive four cassettes 105 at one time. If the spacing between the four tool side stages 307 is narrow, it will not be possible for four typical LPTs to be connected to the front face of the process tool, as all four typical LPTs cannot deliver to the four tool side stages 307.

The narrower construction of the LPTN 1201A allows four LPTNs to be used in parallel to simultaneously deliver four multiple cassettes 105 to the corresponding four tool side stages 307 when the pitch between the locations is narrow (as defined by the process tool interface parameters).

The articulating arm 303 of an LPTN 1201A can include a spiral cam 401 connected to one end of the articulating arm. The end of the articulating arm 303 can be the location where the gripper assembly 305 is coupled to the articulating arm. The spiral cam 401 can provide direction positioning of the cassette 105 when the cassette is placed into the tool side stage 307 of the process tool. Thus, if the location of the cassette 105 targeted within the process tool is a narrow pitch, one or more LPTNs 1201A with spiral cams 401 can be placed side-by-side to increase the capability of delivering cassettes 105 to the tool side stages 307 within the process tool.

FIGS. 15A-J illustrate various views of two LPTNs 1201A, 1201B in a tandem, side by side configuration, in accordance with embodiments of the present invention. two LPTNs 1201A, 1201B in a side by side configuration can be used for a process tool 203 that has two loadlocks or similar loading locations 1102A, 1102B. The two LPTNs 1201A, 1201B used in side by side configuration can have articulating arm 303 on the same sides (e.g., both on the right or both on the left, not shown) or on opposite sides as shown.

Figure 15A:
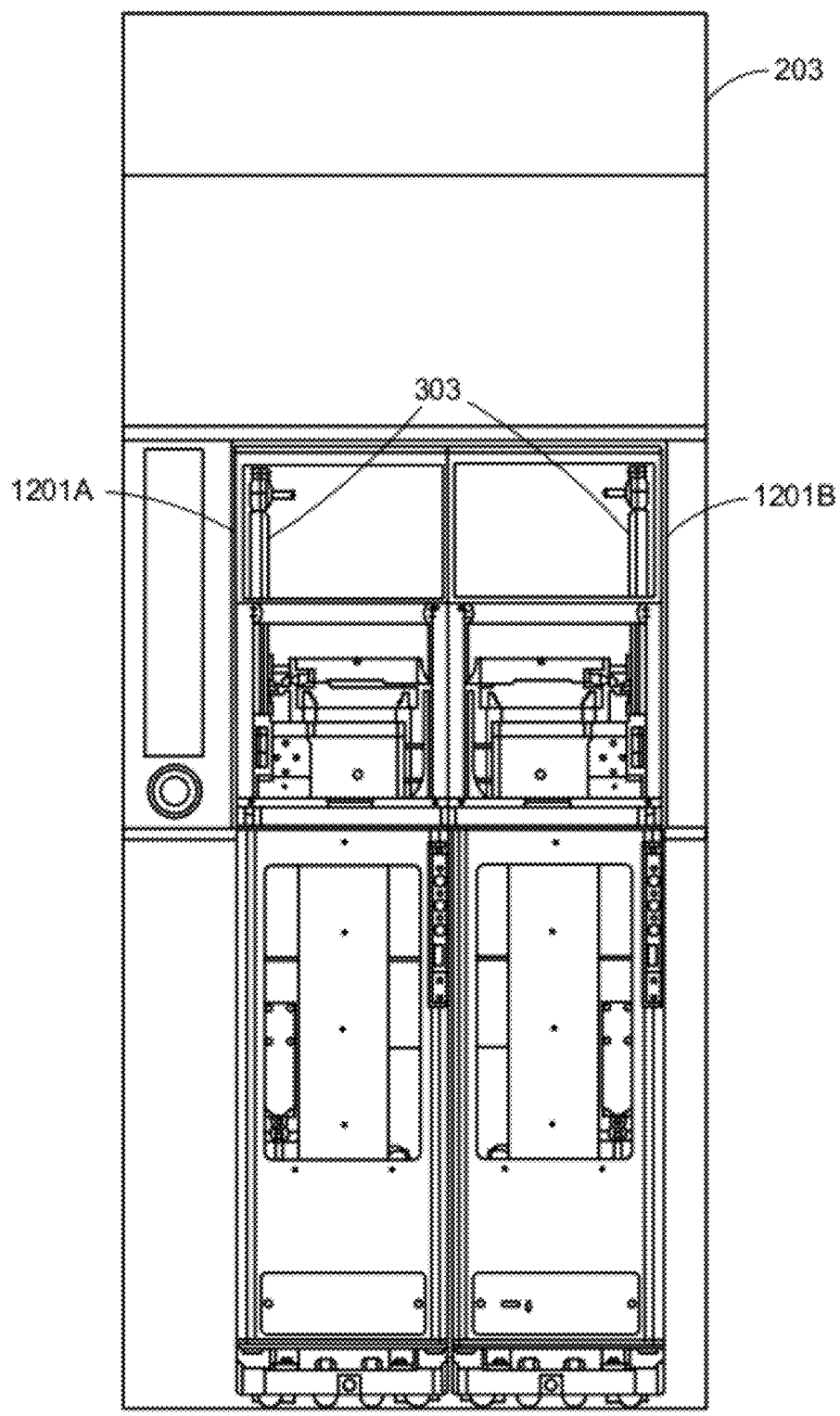
Figure 15C:
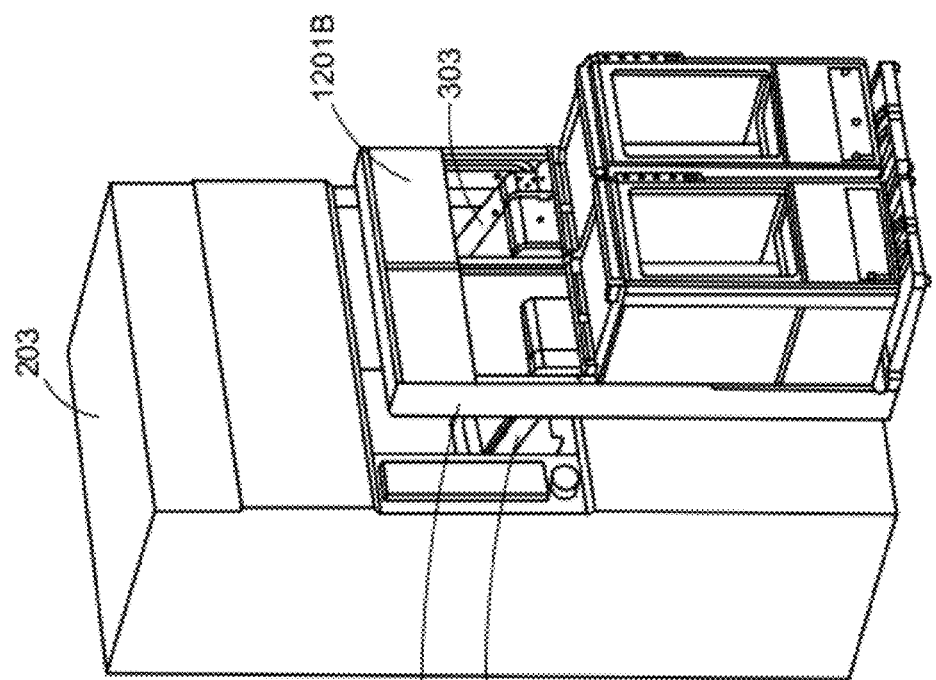
Figure 15B:
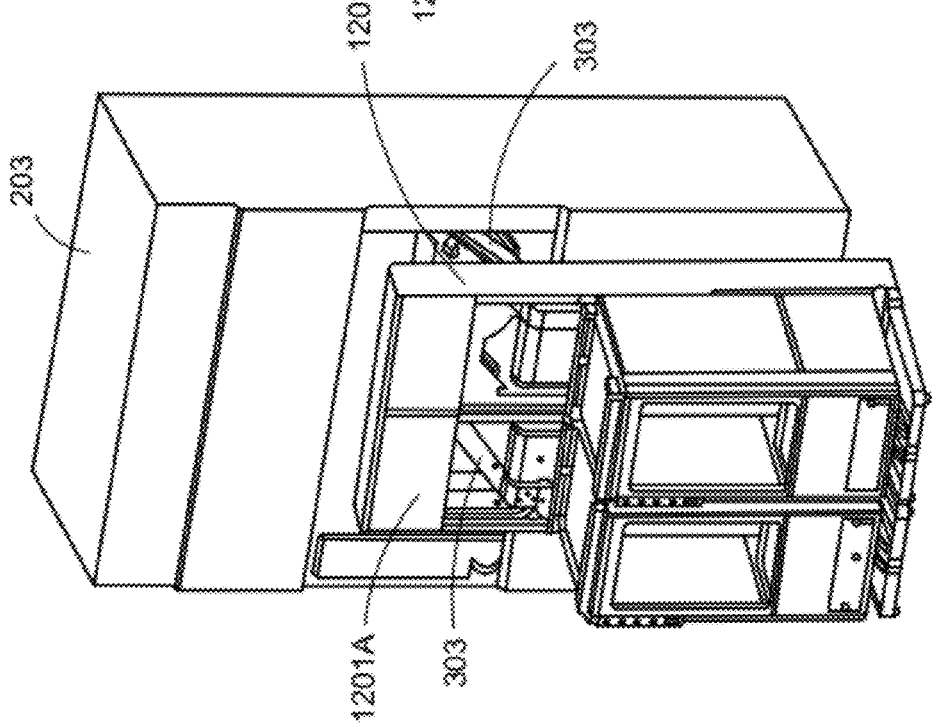
Figure 15F:
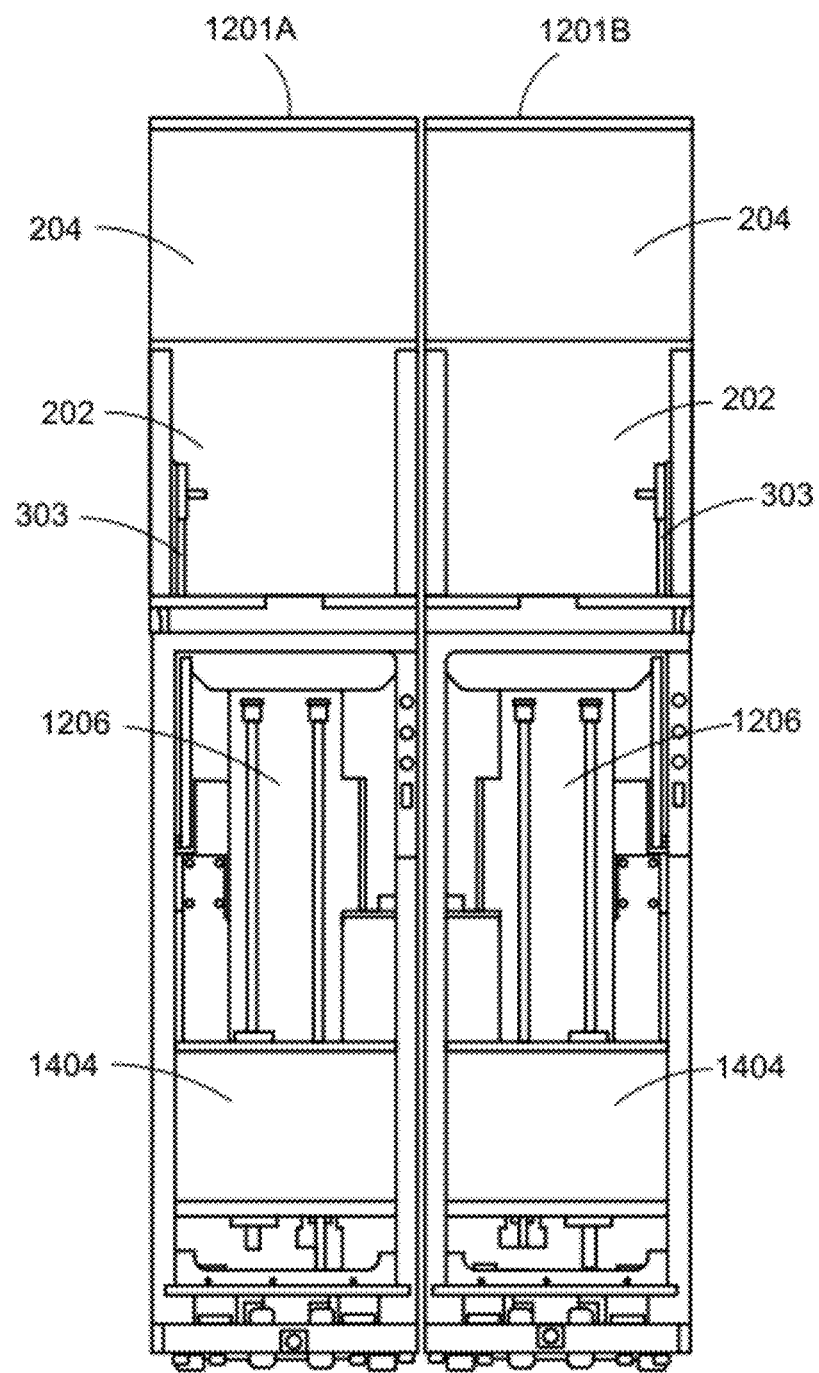
Figure 15G:
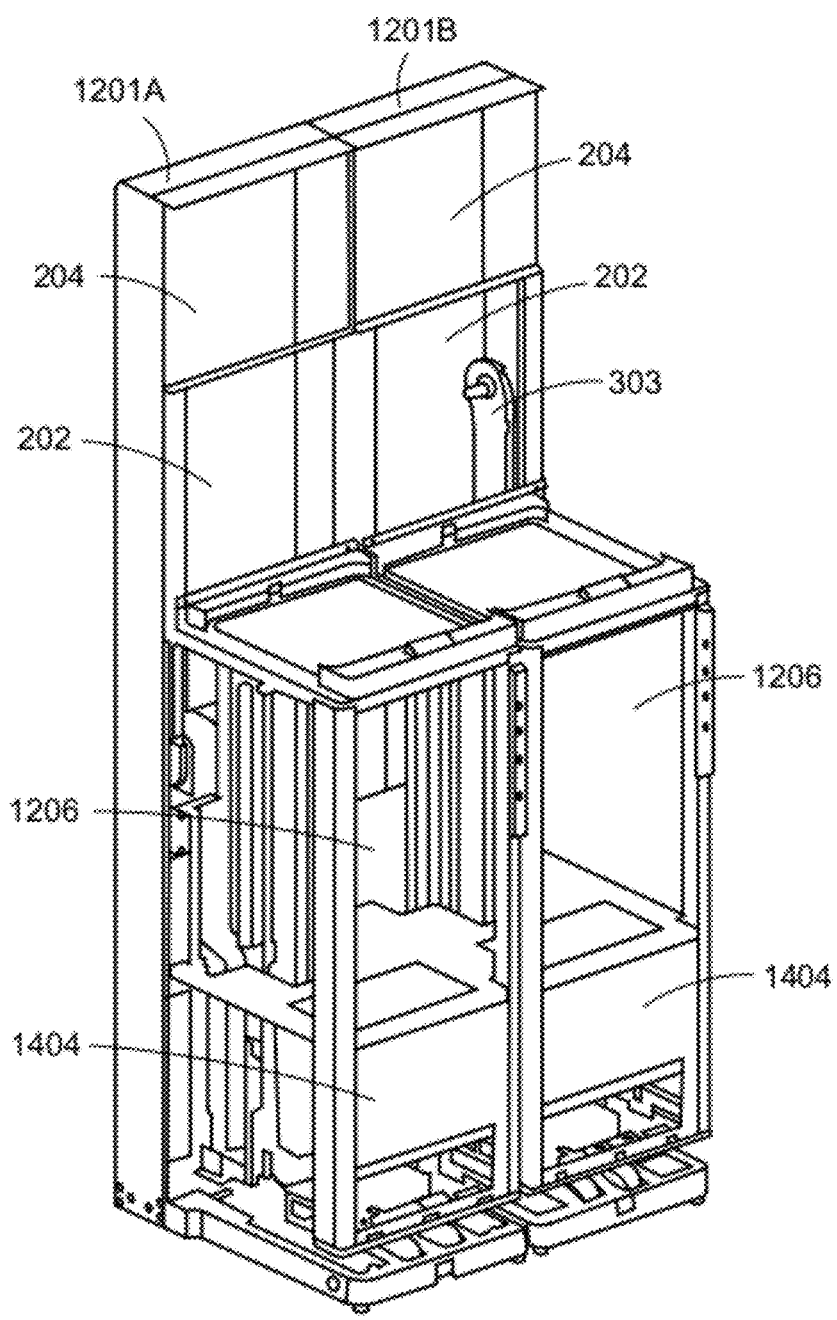
Figure 15H:
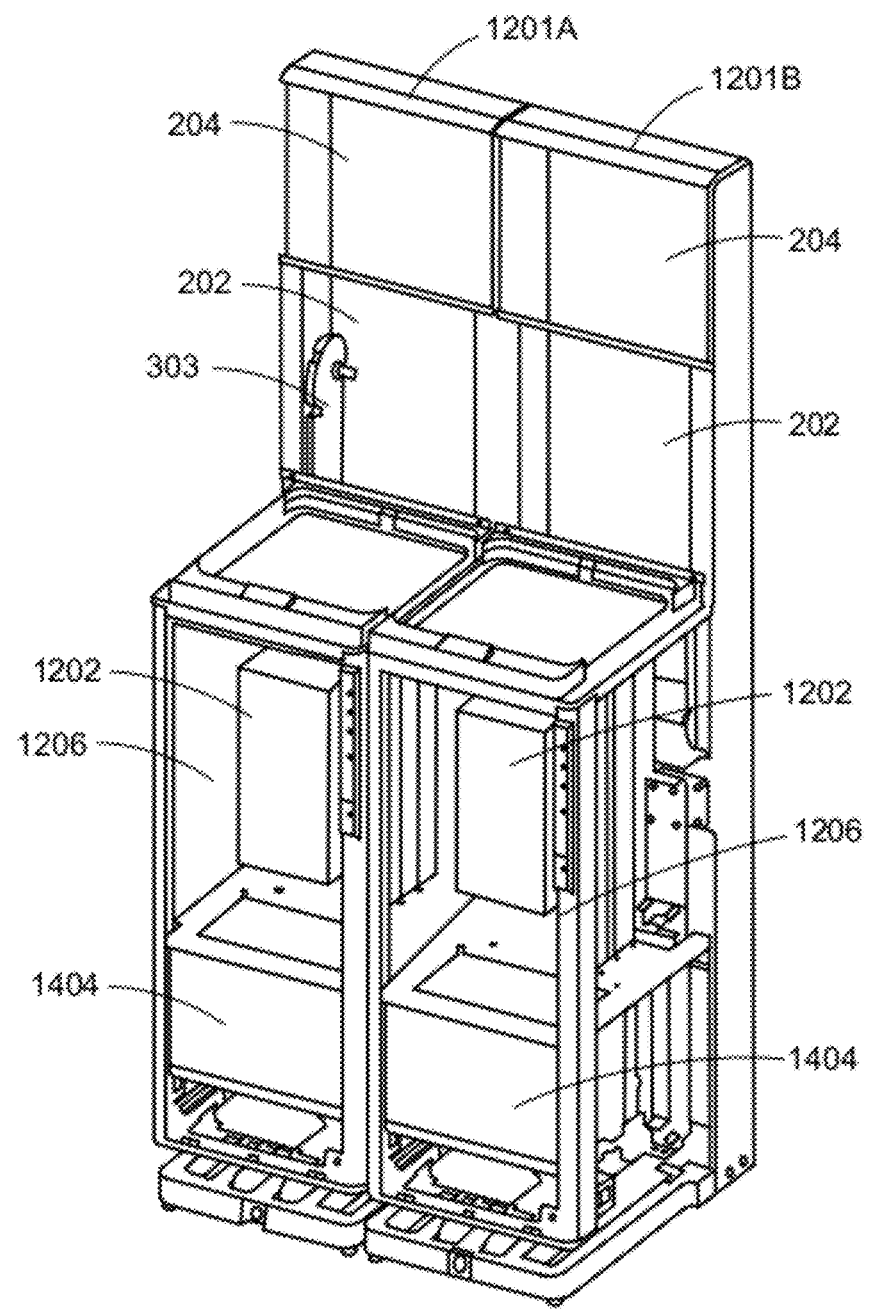
Figure 15I:
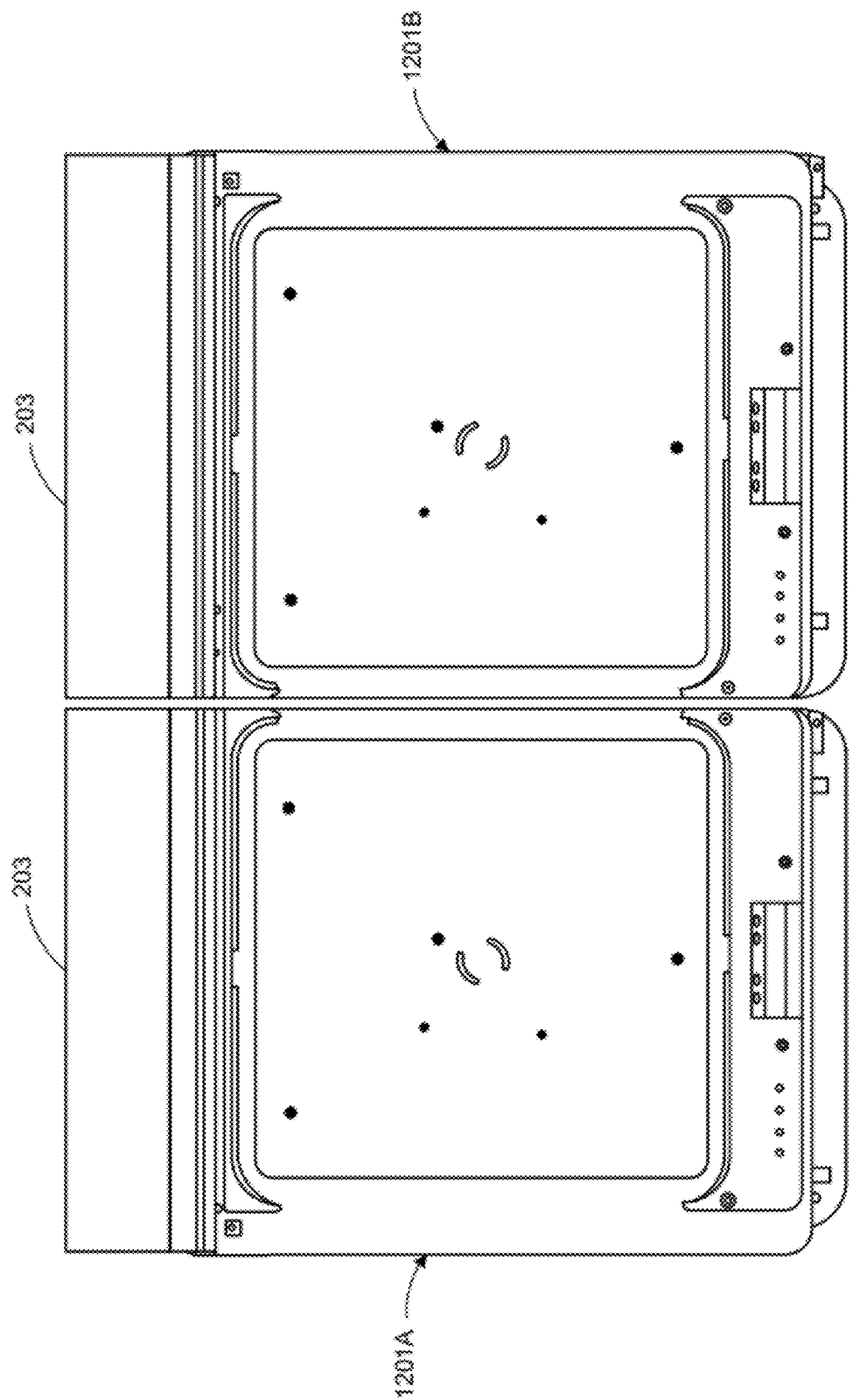
Figure 15J:
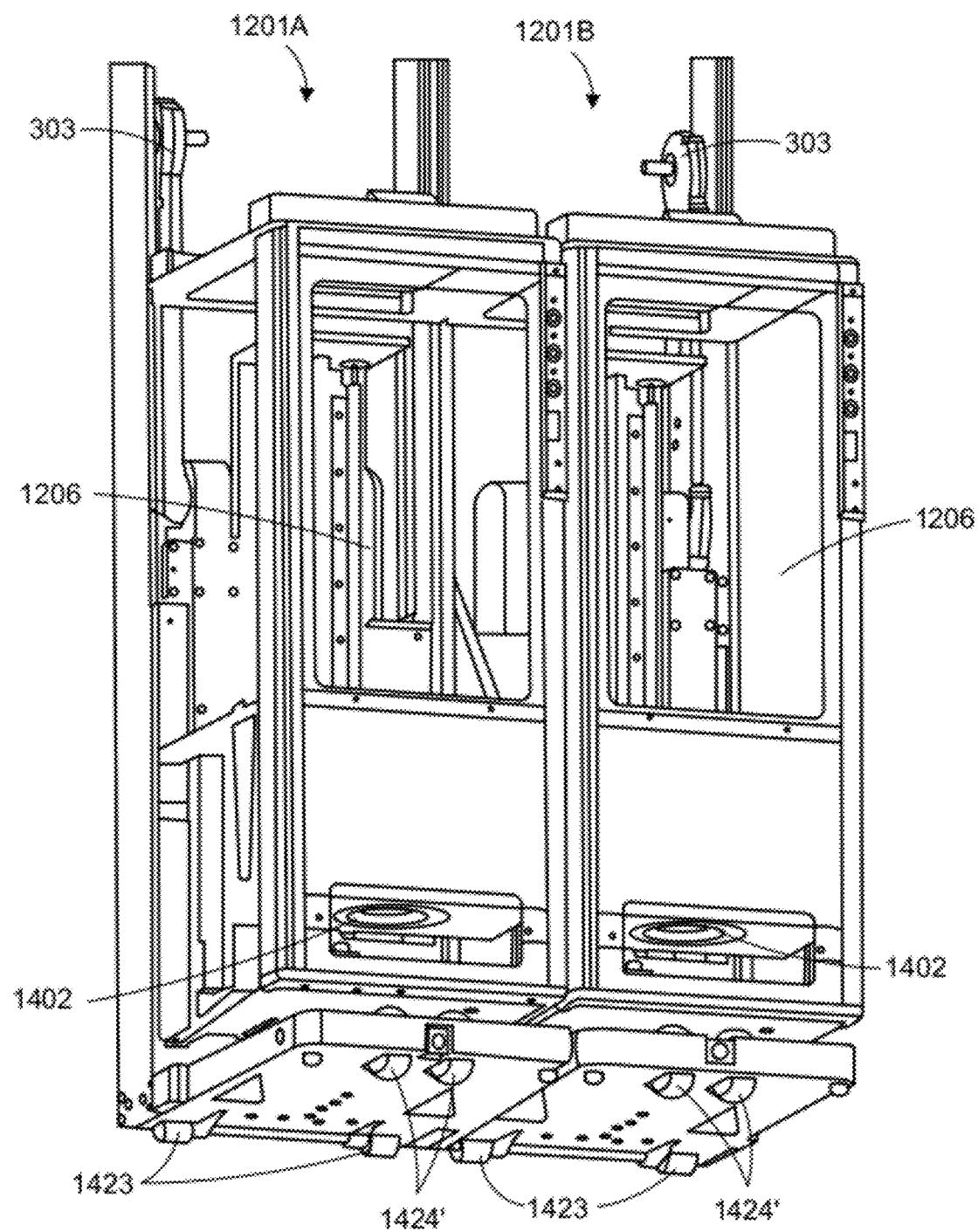

FIGS. 15B and 15C illustrate the articulating arm 303 moving cassettes 105 into the process tool 203. As shown in FIG. 15D the LPTNs 1201A, 1201B articulating arms 303 move the cassettes 105 to locations 1102A, 1102B that are about 310 mm center to center. Also shown in FIG. 15D the side by side configuration LPTNs are aligned with the centerline of the desired cassette locations in the process tool. As shown in FIG. 15E, the articulating arm 303 can move the cassettes 105 up to about 280 mm into the process tool 203. The articulating arms 303 can move the cassettes 105 less or more reach into the process tools 203.

Figure 16B:
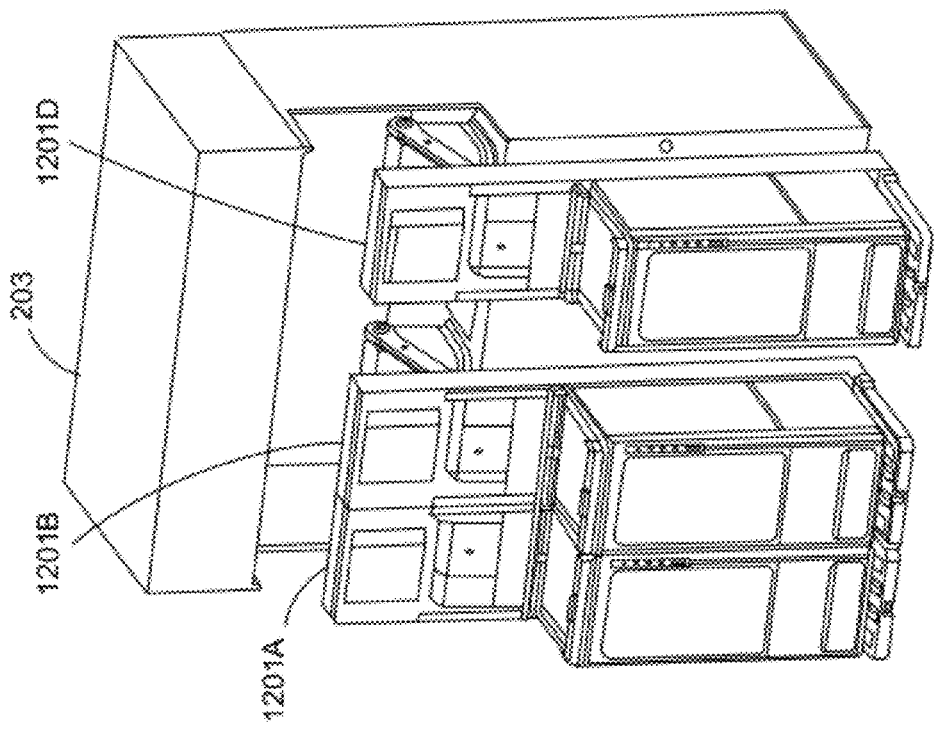
Figure 16A:
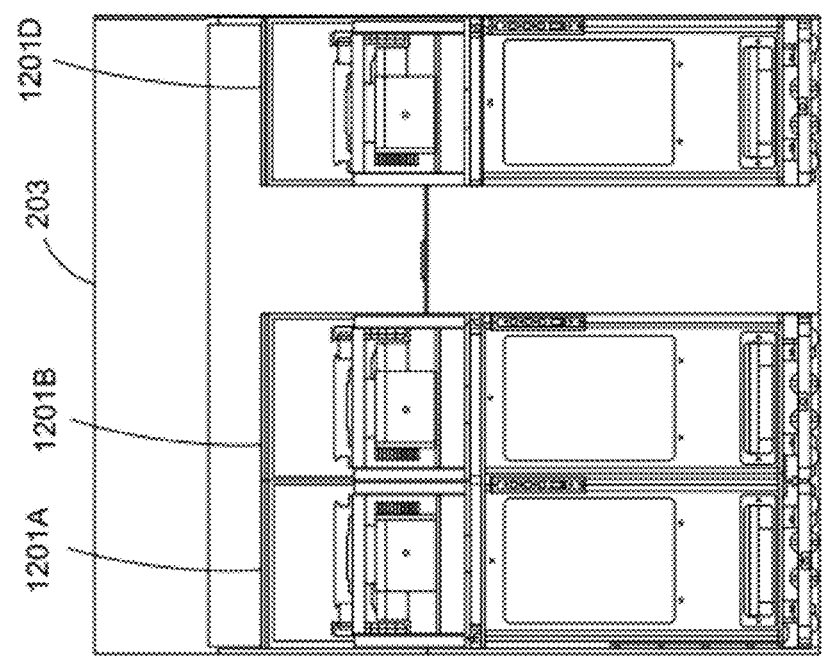

FIGS. 16A-16D illustrate three LPTNs 1201A, 1201B, 1201D used in side by side and single configuration, in accordance with embodiments of the present invention. The three LPTNs 1201A, 1201B, 1201D transport cassettes 105 into a process tool 203 that has three or more loadlocks or similar loading locations 1102A-D. As shown in FIG. 16C each of the LPTNs 1201A, 1201B, 1201D are aligned with the centerline of the corresponding cassette locations 1102A-D in the process tool 203. This increases the throughput of the process tool 203 approximately 50% as compared to using only two typical LPTs 1101A, 1101B as shown above in FIG. 11.

FIGS. 17A-17E illustrate four LPTNs 1201A, 1201B, 1201C, 1201D used in four side by side configuration, in accordance with embodiments of the present invention. The four LPTNs 1201A, 1201B, 1201C, 1201D used in four side by side configuration to transport cassettes 105 into a process tool 203 that has four loadlocks or similar loading locations 1101A, 1101B, 1101C, 1101D.

Figure 17B:
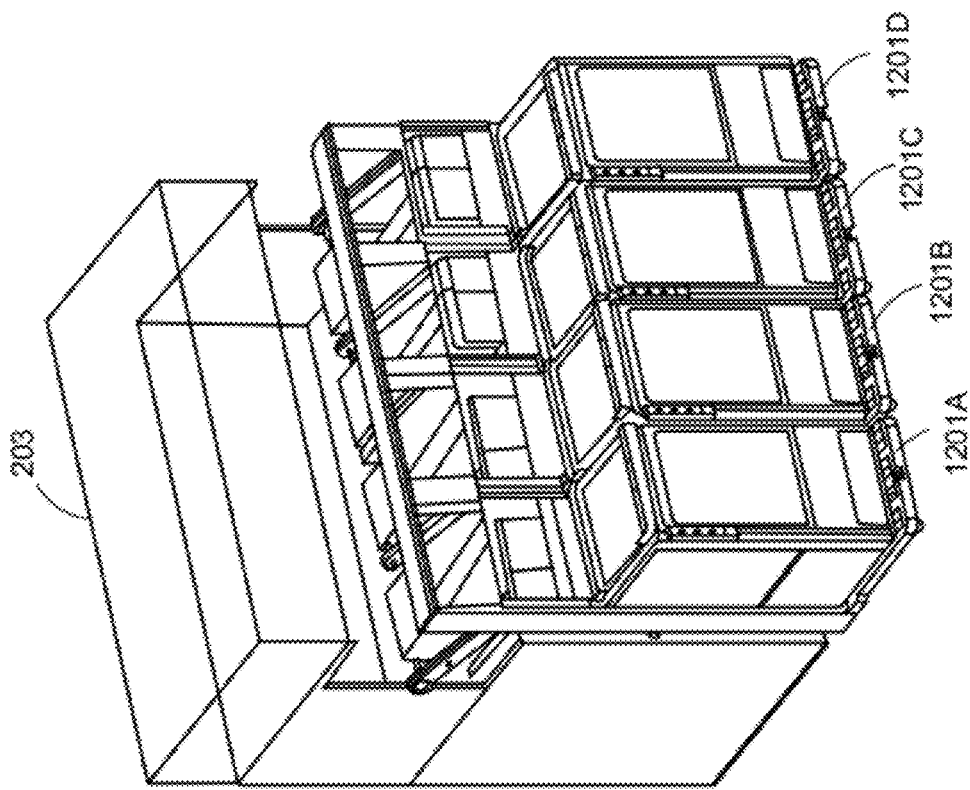
FIGS. 17A-17E illustrate four LPTNs used in four side by side configuration, in accordance with embodiments of the present invention.
Figure 17A:
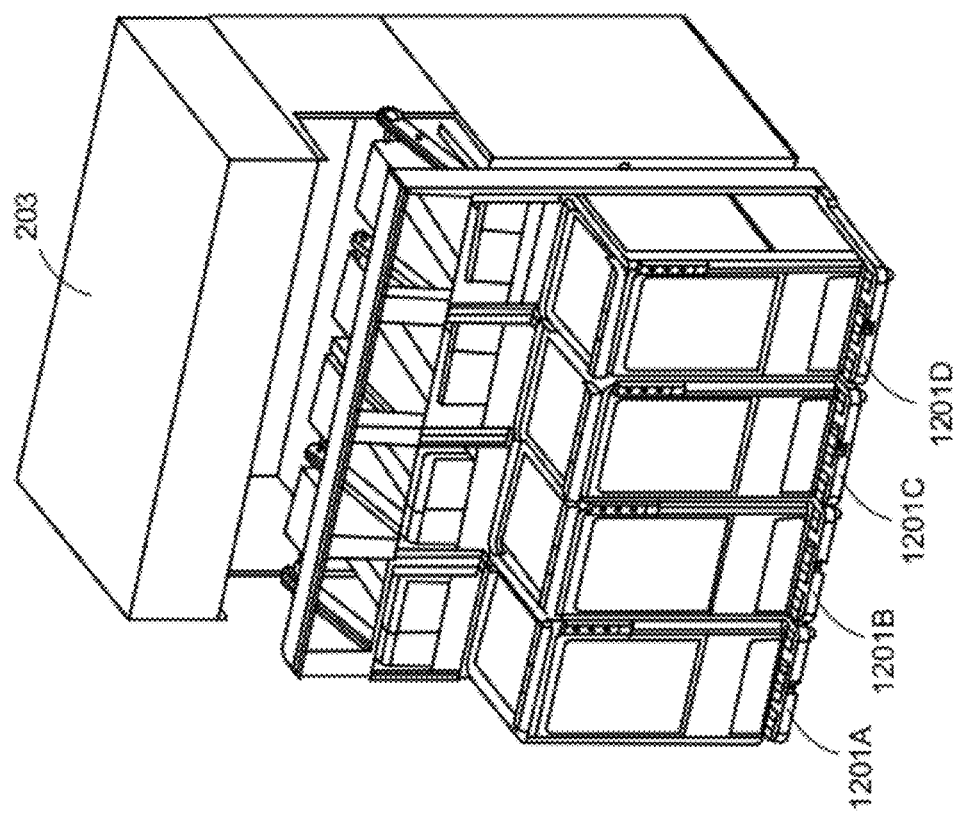
Figure 17D:
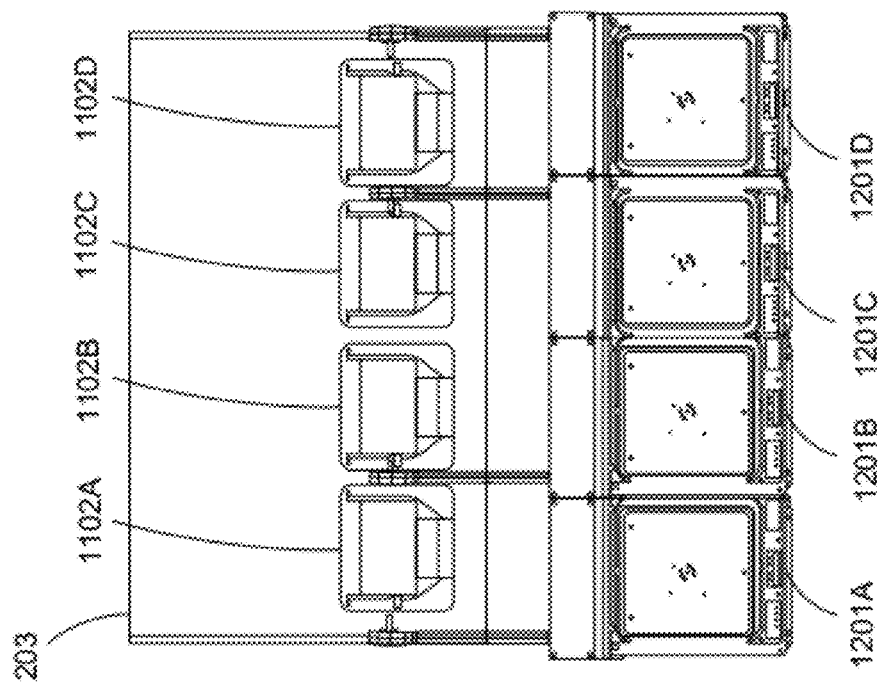
Figure 17C:
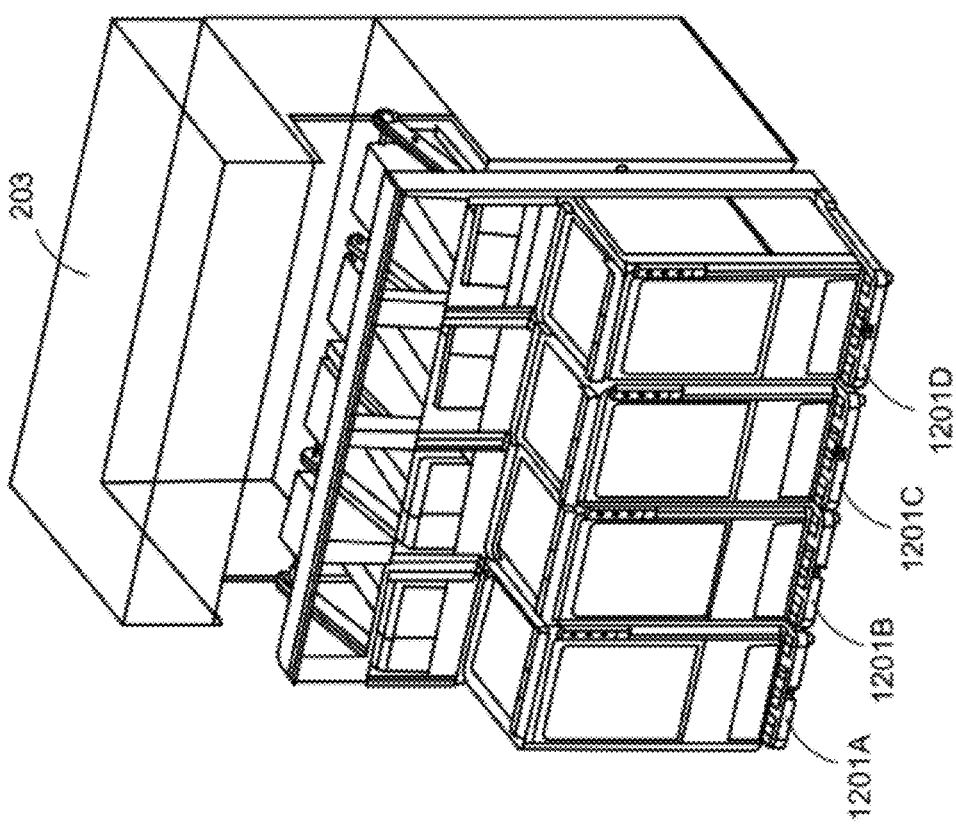
Figure 17E:
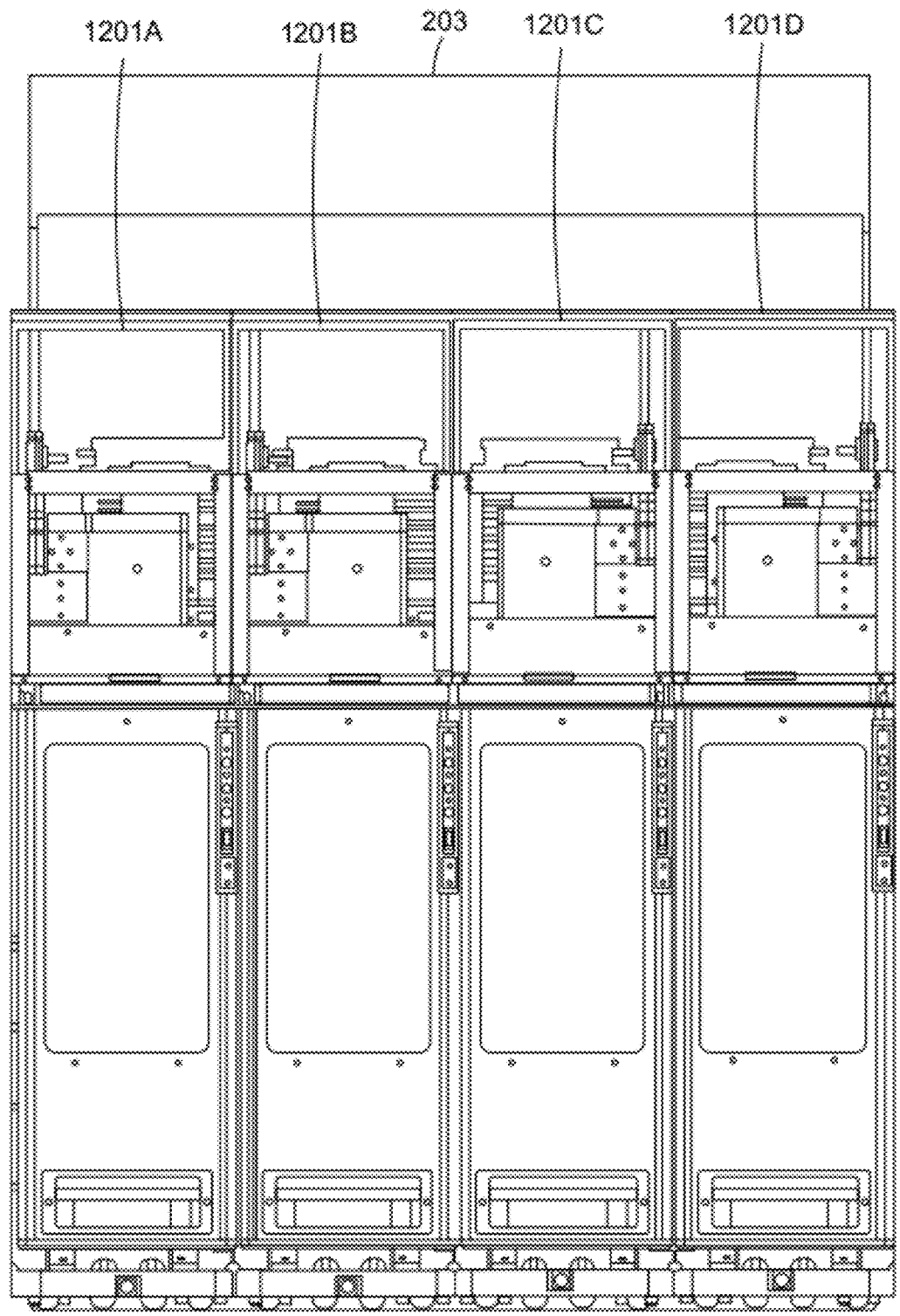

As shown in FIG. 17D each of the LPTNs 1201A, 1201B, 1201C, 1201D are aligned with the centerline of the corresponding cassette locations 1101A, 1101B, 1101C, 1101D in the process tool 203. This increases the throughput of the process tool approximately 100% as compared to using only two typical LPTs 1101A, 1101B as shown above in FIG. 11.

FIGS. 18A-18C illustrate various configurations of the base plate 1810, in accordance with embodiments of the present invention. The various configurations of the base plate 1810 illustrates several possible configurations of the wheels 1423, 1424 therein. As shown in FIG. 18A the outer wheels 1424 are shown having a relatively wide track having a width T being widely separated and very near the respective corners of the base plate 1801.

As shown in FIGS. 18B and 18C an optional location for the outer wheels 1424' and 1424", respectively, that are configured with a relatively narrow track having a width T' (e.g., wheels are closely spaced side by side), where width T' is less than width T and thus the outer wheels 1424' and 1424" are located near the centerline 1802 of the base plate 1801. As shown in FIG. 18C outer wheels 1424" can include three or more wheels.

The inner wheels 1423 on the opposite edge of the base plate 1801 have a substantially wider track T''' as the inner wheels are more closely located near their respective corners. This configuration gives the base plate a near tricycle or three-point contact with the surface. Thus the three-point surface contact can provide more stability for the LPTN 1201A if the surface is uneven. The three-point surface contact can also simplify leveling the LPTN 1201A on an uneven surface.

Figure 19A:
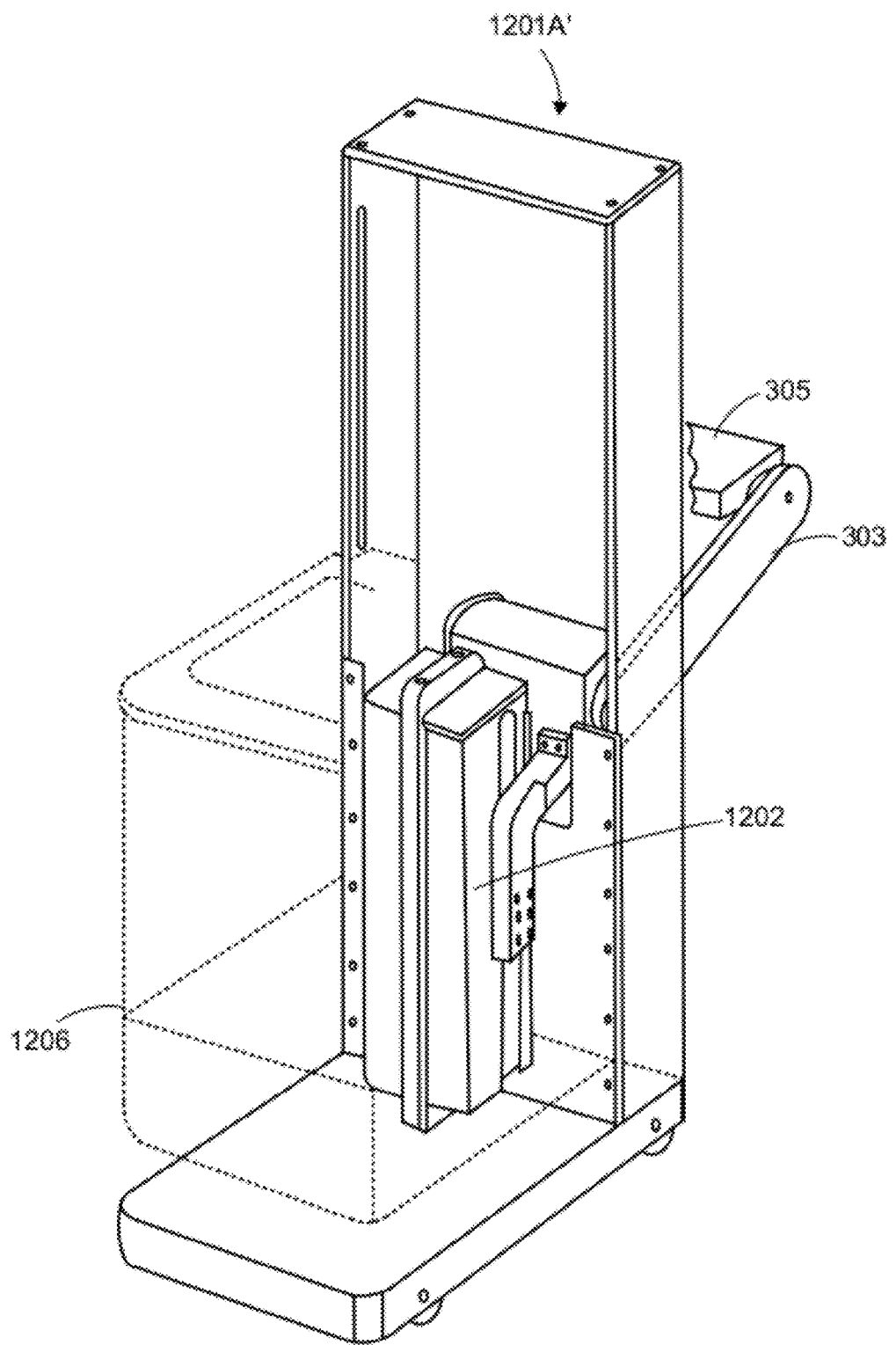
FIGS. 19A-19B illustrate an alternate embodiment of the LPTN, in accordance with embodiments of the present invention.
Figure 19B:
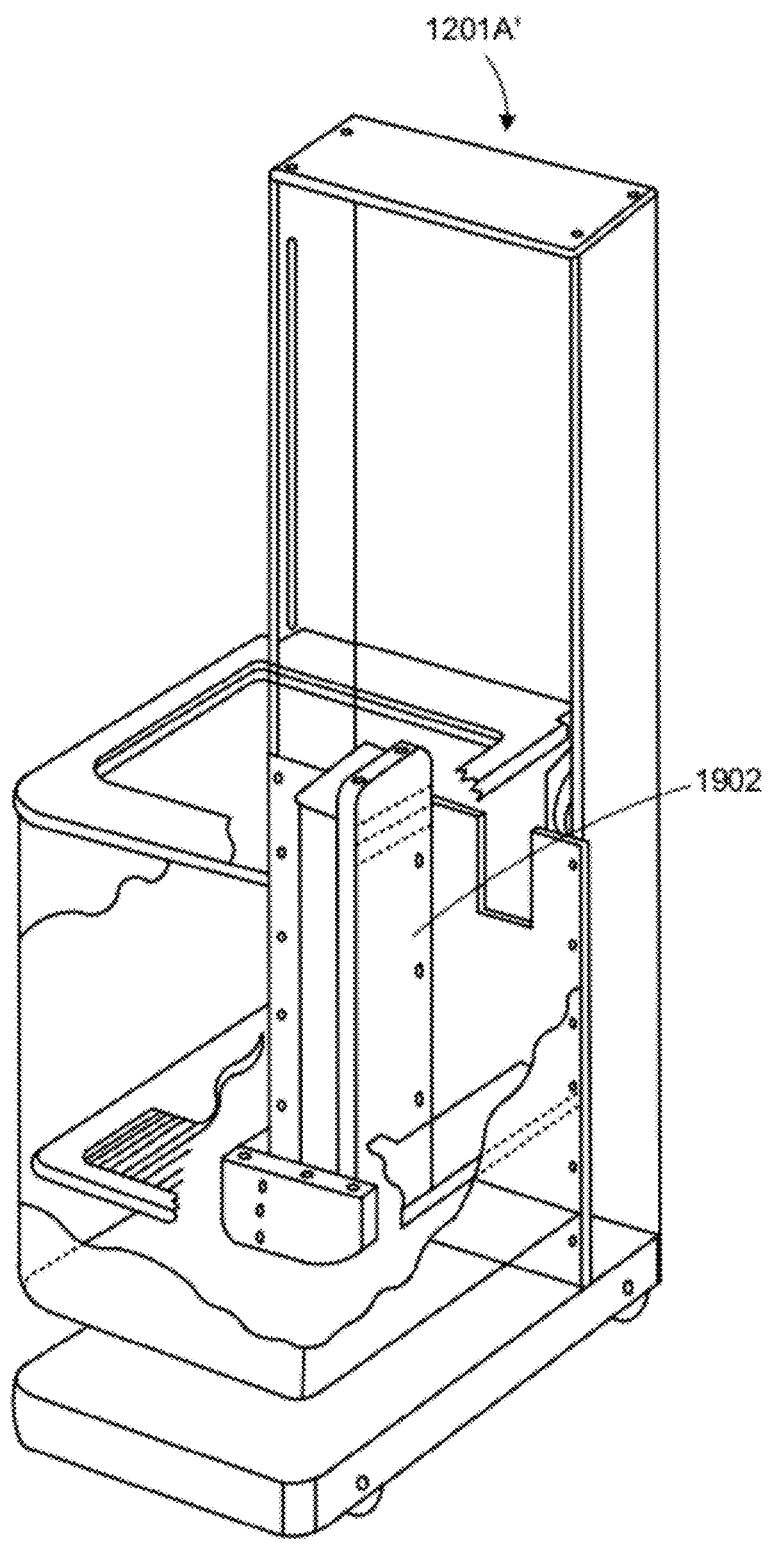
Figure 20F:
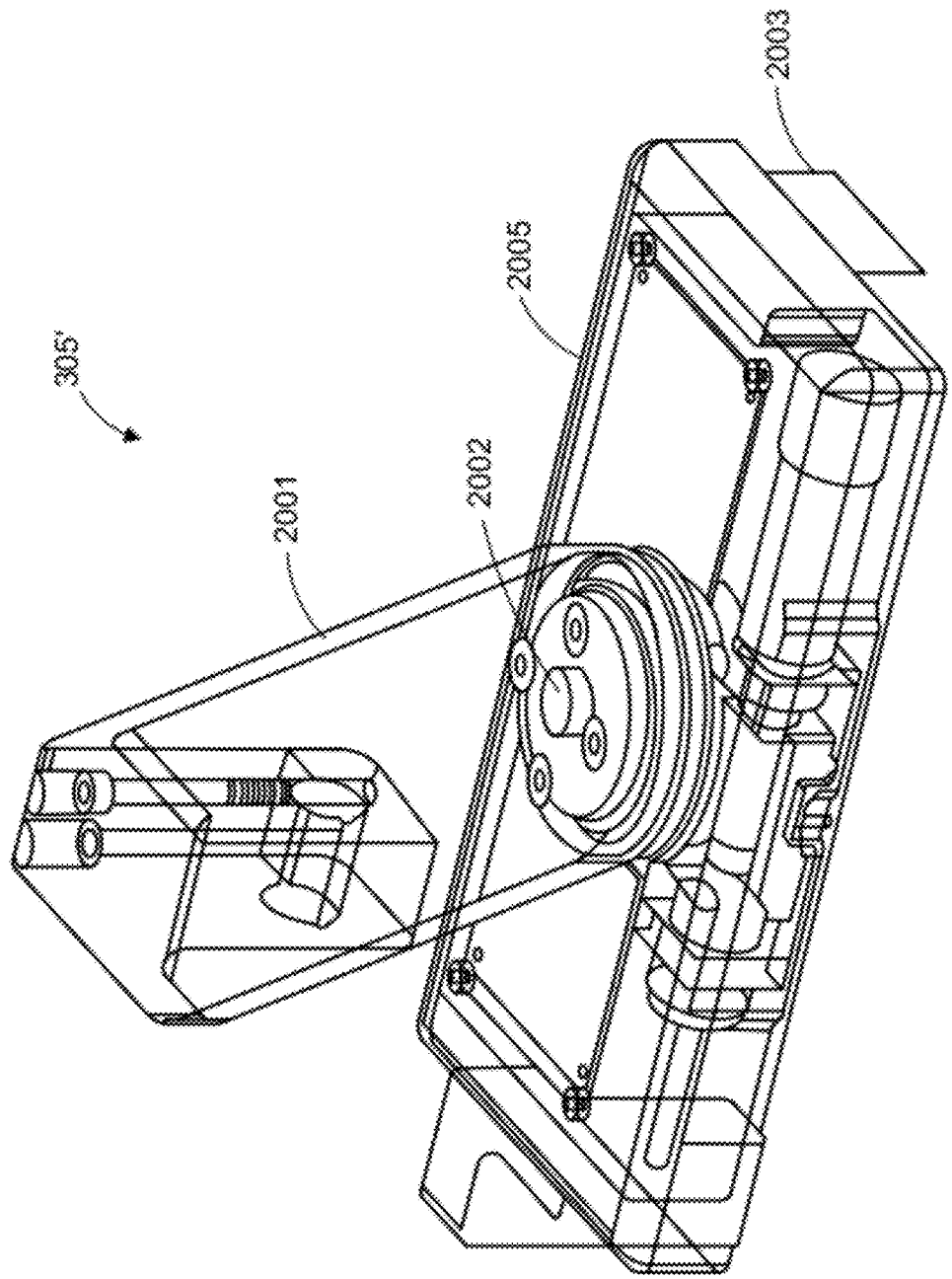
Figure 20G:
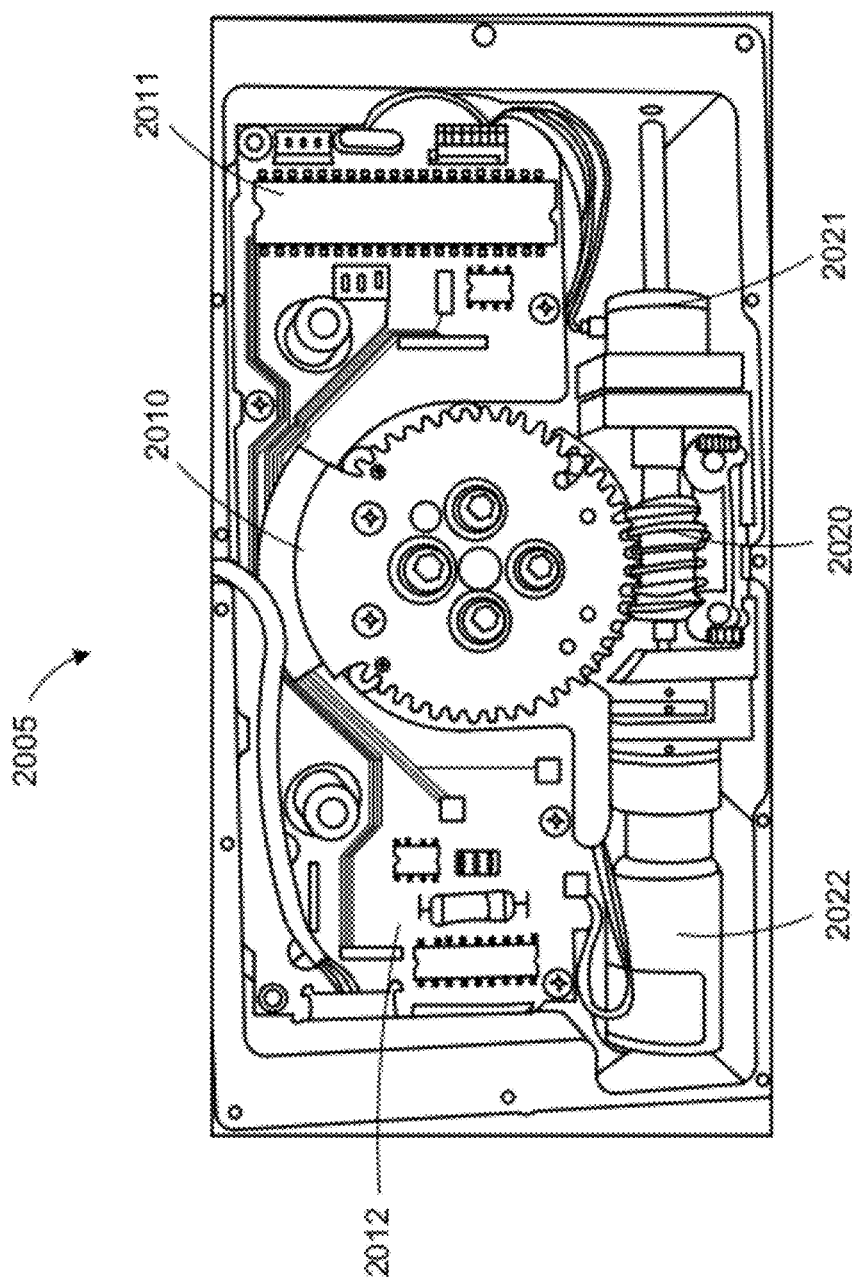
Figure 20I:
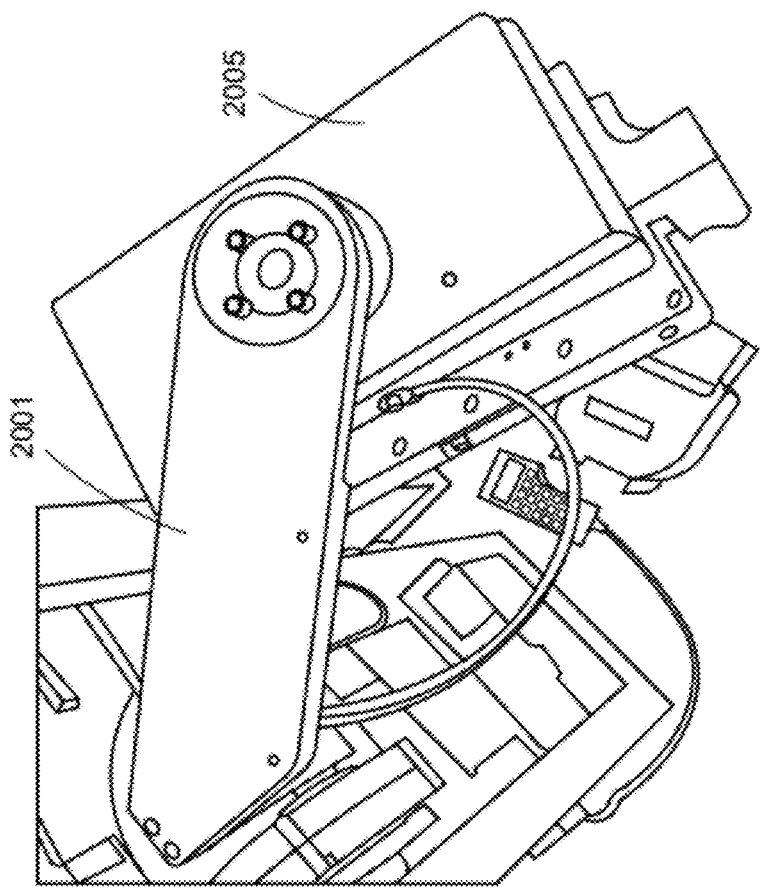
Figure 20H:
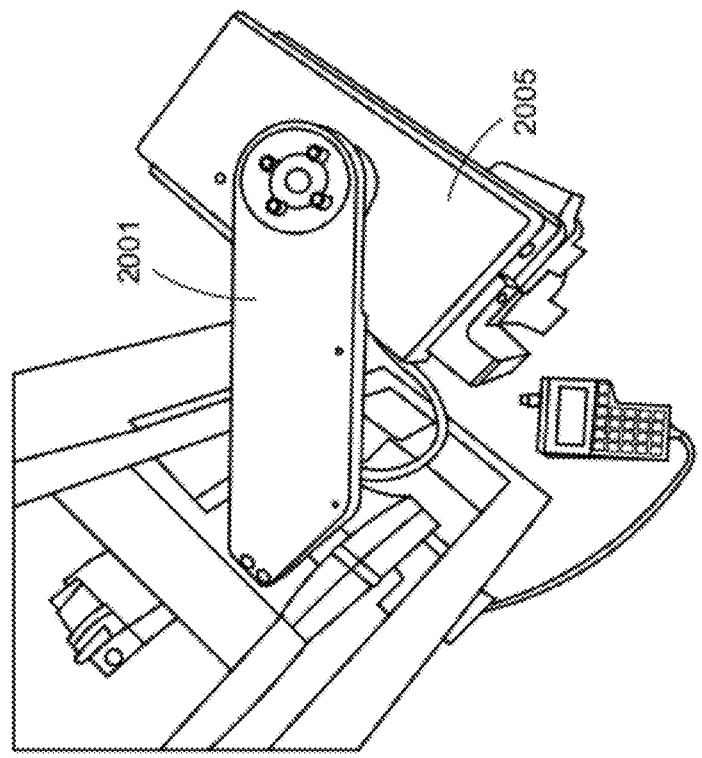
Figure 20K:
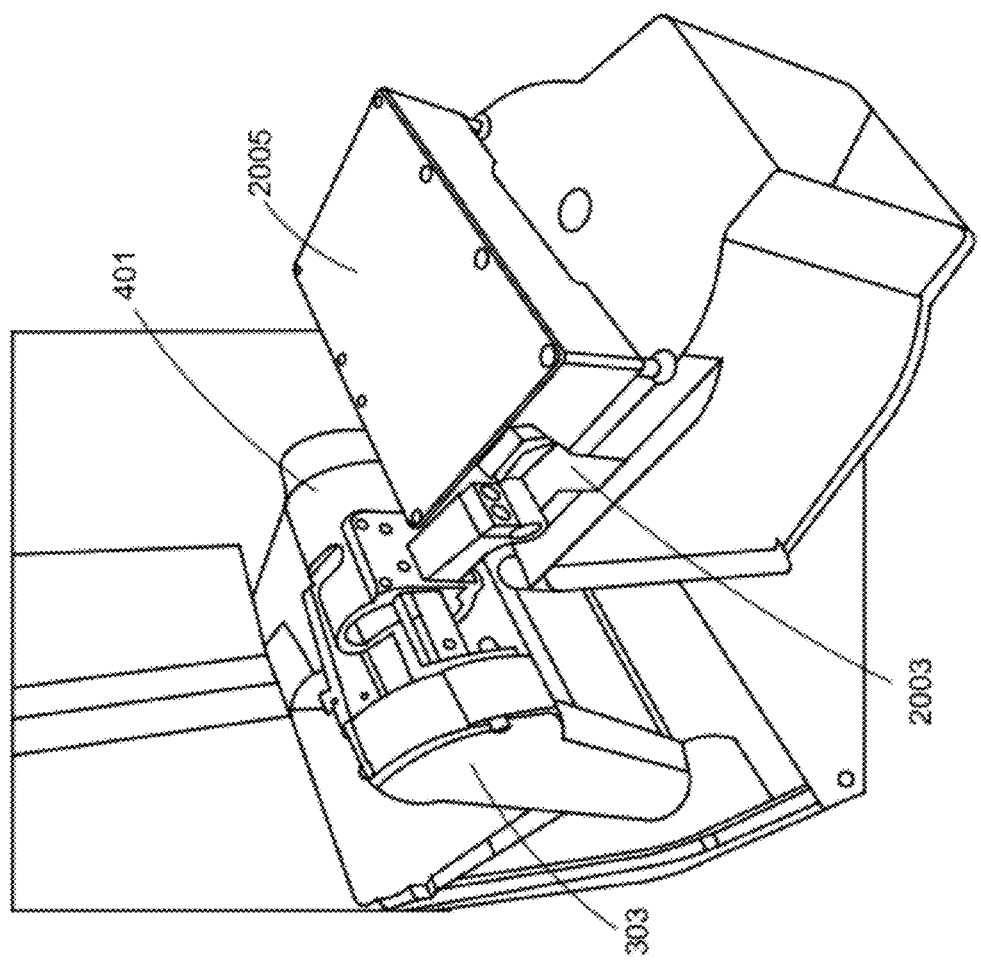
Figure 20J:
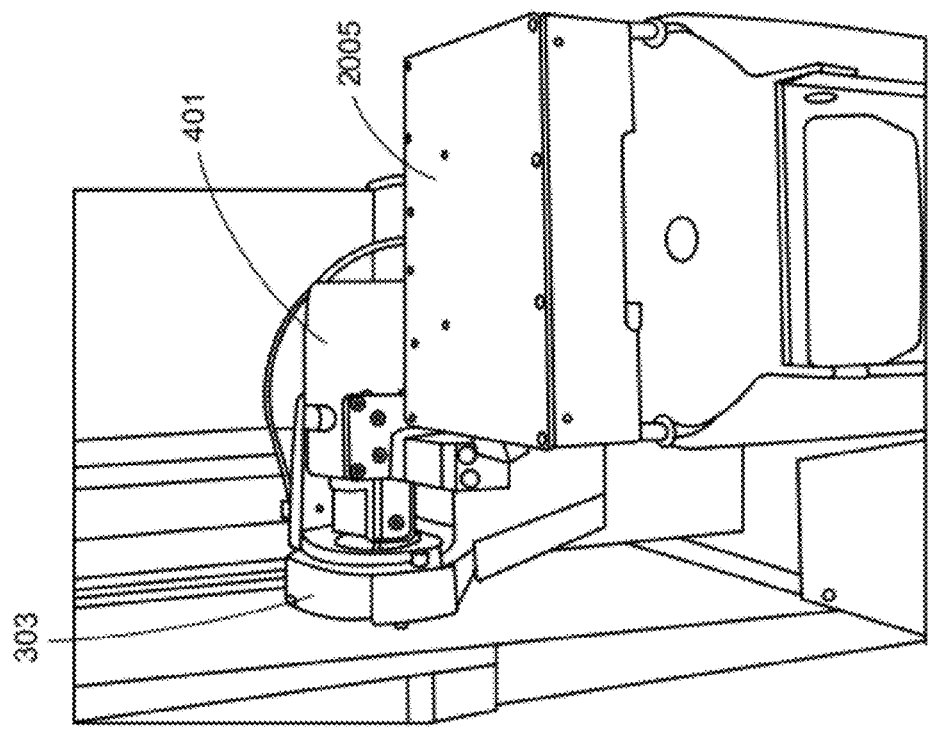
Figure 20L:
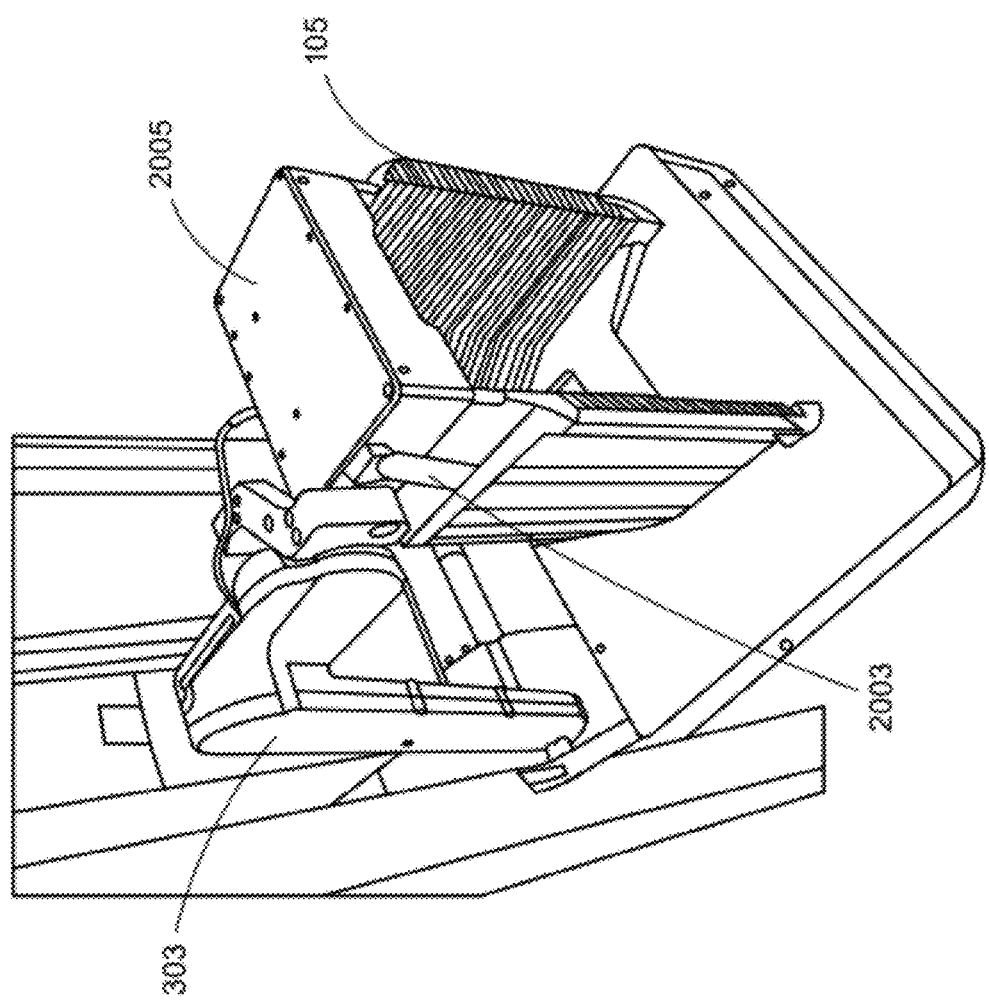

FIGS. 19A-19B illustrate an alternate embodiment of the LPTN 1201A', in accordance with embodiments of the present invention. The alternate embodiment of the LPTN 1201A' includes a single Z axis drive 1902 in place of the dual Z axis drive in the LPTN 1201A. The single Z axis drive 1902 is somewhat simpler and requires on a single Z axis drive mechanism. The drive components within the tower 1202 can raise and lower the mini environment and/or provide the motivation to the articulated arm assembly. As shown in FIG. 19A the drive components within the tower 1202 are coupled to the articulated arm assembly for operating the articulated arm. The articulated arm assembly includes the components 301-305 as described above. The drive components within the tower 1202 can also raise and lower the mini environment 1206 as described above. However it should be understood that an external system could move the min environment to open the substrate isolation container 101 and access the substrates 109 therein. It should also be understood that some process tools may include a robot or other articulated arm that can access the cassette 105 and/or the substrates 109 therein directly from the LPTN 1201A thus rendering one or more of the drive assemblies in the tower 1202 as being redundant and unnecessary.

FIGS. 20A-20L illustrate various configurations of the articulating arm 303 and the gripper assemblies 305, in accordance with embodiments of the present invention. The various configurations of the articulating arm 303 and the gripper assemblies 305, can be used for left and right optional configurations. The articulating arm 303 and the gripper assemblies 305 can enable rotation of the cassette 105 in more than one axis (e.g., pitch and yaw). The articulating arm 303 is coupled to and moved by a dual axis harmonic drive gearbox assembly.

The rotating gripper 305' head addresses the need to deliver cassettes 105 angled receiving stages up to 65 degrees or more (e.g. up to about 90 degrees). The rotating gripper 305' includes a pivot 2002, and an articulating arm extension 2001. The rotating gripper 305' also includes gripper clamps 2003 on each end of the gripper. The rotating gripper 305' also includes motors 2021, 2022 for rotating the gripper 305' about the pivot 2002. A main gear 2010 is mechanically coupled to the pivot 2002. Motor 2021 rotates a worm gear 2020 that is meshed with the main gear 2010, or other precise rotation means (e.g., a belt or cam driven means). And thus causes the rotating gripper 305' to rotate relative to the pivot 2002. Circuit boards 2011 and 2012 provide the controls for the motors 2021, 2022 and the gripper clamps 2003 and feedback (e.g., location and grip sensing) data. Circuit boards 2011 and 2012 also provide a data interface to the LPTN 1201A.

A new generation loadport narrow (LPTN) comprising: a mini environment includes a first fan that forces air though a filter into the mini environment; the inner volume of the mini environment can be a class 1 clean room environment; a tower is included inside the mini environment; the tower includes a second fan drawing air out of the tower and out to the external environment; The tower also includes a plurality of motors, gears, shafts, chains, etc. for moving the mini environment vertically and for operating a transfer arm, multiple movable joints within the transfer arm, and a gripper on the end of the transfer arm; an air flow path includes flowing in through the first fan, through the filter into the mini environment and then into the tower where air is drawn out by the second fan; the tower is included proximate to the bottom portion of the mini environment and substantially centered on a delivery side of the mini environment; the mini environment is held on a frame; the mini environment and the frame have a first width only slightly wider than a width of the "pod" (SMIF, FOUP, etc.) to be delivered; the first diameter is about 12.9 inches (328 mm) for a pod for supporting and transporting substrates having a diameter of about 200 mm; the frame includes a support side that supports the mini environment and allows the mini environment to traverse vertically; the frame also includes a delivery side opposing the support side; the delivery side of the frame can be coupled to any desired processing tool, the first width of the mini environment and frame allows the LPTN to be aligned with correspondingly narrow loading positions on a process tool. Further, multiple (two-four or more) LPTNs can be coupled side by side and aligned to multiple loading positions in a process tool having multiple loading positions; the frame is connected to a base; the secondary enclosure is secured to the base; the base can include three or four wheels on a bottom surface of the base; the three or four wheels can be arranged such that a first two wheels have a first track width and are proximate to a first edge of the base; if only three wheels are used, the third wheel can substantially be centered on the opposing edge of the bottom surface of the base; if four wheels are used, the second 2 wheels can have a second track that is narrower than the first track and the second 2 wheels can substantially be centered on the opposing edge of the bottom surface of the base; the transfer arm can be on the left or the right edge of the delivery side of the frame; the transfer arm can include a gripper; the gripper can rotate in at least 1 axis on the end of the transfer arm; the gripper can rotate in 1-3 axes on the end of the transfer arm.

An advantage of the LPTN architecture using the vertical drive/guiding mechanism approximately under the centerline of the SMIF Pod is that not only is the unit much narrower, but the mechanism for the left and right versions is almost identical.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, validation, verifying or comparing.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices (e.g., smart tags RF ID communication and other radio or wireless identification systems). The computer readable medium can also be distributed over a network coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A loadport comprising:
a frame;
an articulating arm;
a mini environment; and
a tower enclosure disposed below a port plate, within the mini environment, the tower enclosure including:
a plurality of motors, a first one of the plurality of motors mechanically coupled to the mini environment for moving the mini environment vertically, a second one of the plurality of motors mechanically coupled to the articulating arm for moving the articulating arm; and
the tower enclosure isolating the plurality of motors from the mini environment, wherein the tower enclosure includes a system for preventing air flow from inside the tower enclosure and into the mini environment, the system for preventing air flow including a second fan for drawing air out of the mini environment, into the tower enclosure and to an environment external from the loadport, the second fan configured to draw air in a vertical direction toward a bottom of the loadport.

2. The system of claim 1, wherein the plurality of motors are disposed between the mini environment and a base plate of the loadport, the base plate coupled to the frame.

3. The system of claim 1, wherein the mini environment includes a filter assembly and a first fan coupled to the filter assembly for directing filtered air though the filter assembly and into the mini environment.

4. The system of claim 1, wherein the second fan draws air through the second fan and out of the tower enclosure in a downward direction.

5. The system of claim 1, wherein an inner volume of the mini environment is a class 1 cleanliness environment.

6. The system of claim 1, wherein the plurality of motors include a third one of the plurality of motors mechanically coupled to the articulating arm for moving the articulating arm horizontally away from the frame and toward a process tool.

7. The system of claim 1, wherein articulating arm includes a gripper assembly.

8. The system of claim 7, wherein the gripper assembly includes a rotating gripper.

9. The system of claim 1, wherein the loadport has a width functionally equal to a width of a substrate cassette location in a process tool.

10. A substrate transport system comprising:
a plurality of loadports coupled to a process tool, the process tool having a plurality of substrate cassette locations, each one of the plurality of loadports includes:
a frame;
an articulating arm;
a mini environment;
a tower enclosure below the port plate, within the mini environment, the tower including:
a plurality of motors, a first one of the plurality of motors mechanically coupled to the mini environment for moving the mini environment vertically, a second one of the plurality of motors mechanically coupled to the articulating arm assembly for moving the articulating arm assembly; and
the tower enclosure isolating the plurality of motors from the mini environment, wherein the tower enclosure includes a system for preventing air flow from inside the tower enclosure and into the mini environment, the system for preventing air flow including a second fan for drawing air out of the mini environment, into the tower enclosure and to an environment external from the loadport, the second fan configured to draw air in a vertical direction toward a bottom of the loadport;
wherein each one of the plurality of loadports is aligned with a corresponding one of the plurality of the substrate cassette locations in the process tool.

11. The system of claim 10, wherein each one of the loadports has a width substantially equal to a width of one of the plurality of substrate cassette locations.

12. The system of claim 1, wherein the tower enclosure reduces a volume of the mini environment.

13. The system of claim 1, wherein the tower enclosure is substantially aligned with a center line of the loadport.

14. The system of claim 10, wherein the tower enclosure reduces a volume of the mini environment.

15. The system of claim 10, wherein the tower enclosure is substantially aligned with a center line of the loadport.

16. A loadport comprising:
a frame;
an articulating arm;
a mini environment;
a tower enclosure disposed below a port plate, within the mini environment, the tower enclosure including:
a plurality of motors, a first one of the plurality of motors mechanically coupled to the mini environment for moving the mini environment vertically, a second one of the plurality of motors mechanically coupled to the articulating arm for moving the articulating arm;
the tower enclosure isolating the plurality of motors from the mini environment, wherein the tower enclosure includes a system for preventing air flow from inside the tower enclosure and into the mini environment, the system for preventing air flow including a second fan for drawing air out of the mini environment, into the tower enclosure and to an environment external from the loadport, the second fan configured to draw air in a vertical direction toward a bottom of the loadport.

17. The system of claim 16, further comprising an air outlet disposed near a bottom portion of the tower enclosure.

18. The system of claim 16, wherein the tower enclosure is substantially aligned with a center line of the loadport.

* * * * *